United States Patent
Son et al.

(10) Patent No.: US 10,847,537 B2
(45) Date of Patent: Nov. 24, 2020

(54) THREE-DIMENSIONAL SEMICONDUCTOR MEMORY DEVICE

(71) Applicant: Samsung Electronics Co., Ltd., Suwon-si (KR)

(72) Inventors: Young Hwan Son, Hwaseong-si (KR); Seo Goo Kang, Seoul (KR); Shin Hwan Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/262,100

(22) Filed: Jan. 30, 2019

(65) Prior Publication Data

US 2020/0027894 A1  Jan. 23, 2020

(30) Foreign Application Priority Data

Jul. 18, 2018 (KR) .................. 10-2018-0083581

(51) Int. Cl.

| | | |
|---|---|---|
| *H01L 27/11582* | (2017.01) | |
| *G11C 16/04* | (2006.01) | |
| *H01L 27/11524* | (2017.01) | |
| *H01L 27/11556* | (2017.01) | |
| *H01L 27/1157* | (2017.01) | |
| *H01L 27/11573* | (2017.01) | |
| *H01L 27/11526* | (2017.01) | |

(52) U.S. Cl.
CPC .... *H01L 27/11582* (2013.01); *G11C 16/0483* (2013.01); *H01L 27/1157* (2013.01); *H01L 27/11524* (2013.01); *H01L 27/11556* (2013.01); *H01L 27/11526* (2013.01); *H01L 27/11573* (2013.01)

(58) Field of Classification Search
CPC .......... H01L 27/11524; H01L 27/1156; H01L 27/1157; H01L 27/11582; H01L 27/2454; H01L 27/2481; H01L 29/40117; H01L 29/42324; H01L 29/66833; H01L 29/7827; H01L 29/7889; H01L 29/7926
See application file for complete search history.

(56) References Cited

U.S. PATENT DOCUMENTS

| | | |
|---|---|---|
| 8,618,603 B2 | 12/2013 | Ozawa et al. |
| 8,748,249 B2 | 6/2014 | Yang et al. |
| 8,872,183 B2 | 10/2014 | Chang et al. |
| 8,969,948 B2 | 3/2015 | Simsek-Ege et al. |
| 8,981,458 B2 | 3/2015 | Lee et al. |
| 9,806,185 B2 | 10/2017 | Lee |
| 9,812,526 B2 | 11/2017 | Shin et al. |
| 9,824,966 B1 | 11/2017 | Kanakamedala et al. |
| 9,899,412 B2 | 2/2018 | Lee et al. |

(Continued)

*Primary Examiner* — David C Spalla
(74) *Attorney, Agent, or Firm* — Harness, Dickey & Pierce, P.L.C.

(57) ABSTRACT

A three-dimensional semiconductor memory device includes: gate electrodes and mold insulation layers alternately stacked on a substrate; a channel layer passing through the gate electrodes and the mold insulation layers; and a gate dielectric layer between the gate electrodes and the channel layer. The gate dielectric layer and the channel layer may be in an upper portion of the substrate and may be bent at a first angle and extend under the mold insulation layers in the upper portion of the substrate.

13 Claims, 23 Drawing Sheets

(56) References Cited

U.S. PATENT DOCUMENTS

| | | | |
|---|---|---|---|
| 2012/0199897 A1* | 8/2012 | Chang | H01L 21/8221 |
| | | | 257/314 |
| 2014/0264533 A1 | 9/2014 | Simsek-Ege et al. | |
| 2016/0133752 A1 | 5/2016 | Hopkins et al. | |
| 2016/0233231 A1* | 8/2016 | Lee | H01L 27/1157 |
| 2017/0084624 A1* | 3/2017 | Lee | H01L 27/1157 |
| 2017/0229472 A1* | 8/2017 | Lu | H01L 27/11582 |
| 2018/0122906 A1* | 5/2018 | Yu | H01L 27/11565 |

* cited by examiner

THREE-DIMENSIONAL SEMICONDUCTOR MEMORY DEVICE

CROSS-REFERENCE TO RELATED APPLICATION

This application claims priority to Korean Patent Application No. 10-2018-0083581 filed on Jul. 18, 2018 in the Korean Intellectual Property Office, the disclosure of which is incorporated by reference herein in its entirety.

BACKGROUND

1. Field

The present inventive concepts relate to a three-dimensional semiconductor memory device.

2. Description of Related Art

Electronic products require higher-capacity data processing, even while becoming smaller in volume. Therefore, it is useful to increase the degree of integration of semiconductor memory devices used in such electronic products. As one method for improving the degree of integration of semiconductor memory devices, a semiconductor memory device including memory cells having a vertical transistor structure instead of the conventional planar transistor structure has been proposed.

SUMMARY

An example embodiment of the present inventive concepts is to provide a three-dimensional semiconductor memory device, advantageous for higher integration.

An example embodiment of the present inventive concepts is to provide a method of manufacturing a three-dimensional semiconductor memory device, advantageous for high integration.

According to an example embodiment of the present inventive concepts, a three-dimensional semiconductor memory device includes: gate electrodes and mold insulation layers alternately stacked on a substrate; a channel layer passing through the gate electrodes and the mold insulation layers; and a gate dielectric layer between the gate electrodes and the channel layer. The gate dielectric layer and the channel layer may be in an upper portion of the substrate and may be bent at a first angle and extend under the mold insulation layers in the upper portion of the substrate.

According to an example embodiment of the present inventive concepts, a three-dimensional semiconductor memory device includes: gate electrodes and mold insulation layers alternately stacked on a substrate; and a channel structure passing through the gate electrodes and the mold insulation layers, and inserted into a recess in an upper portion of the substrate. A width of the channel structure may gradually decrease toward the substrate, and may increase again in the upper portion of the substrate.

According to an example embodiment of the present inventive concepts, a three-dimensional semiconductor memory device includes: a substrate in which a recess is formed; gate electrodes and mold insulation layers alternately stacked on the substrate; a channel hole passing through the gate electrodes and the mold insulation layers; and a channel structure in the channel hole, and inserted into the recess of the substrate. At least a portion of the recess may have a width wider than a width of a lower portion of the channel hole.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1:
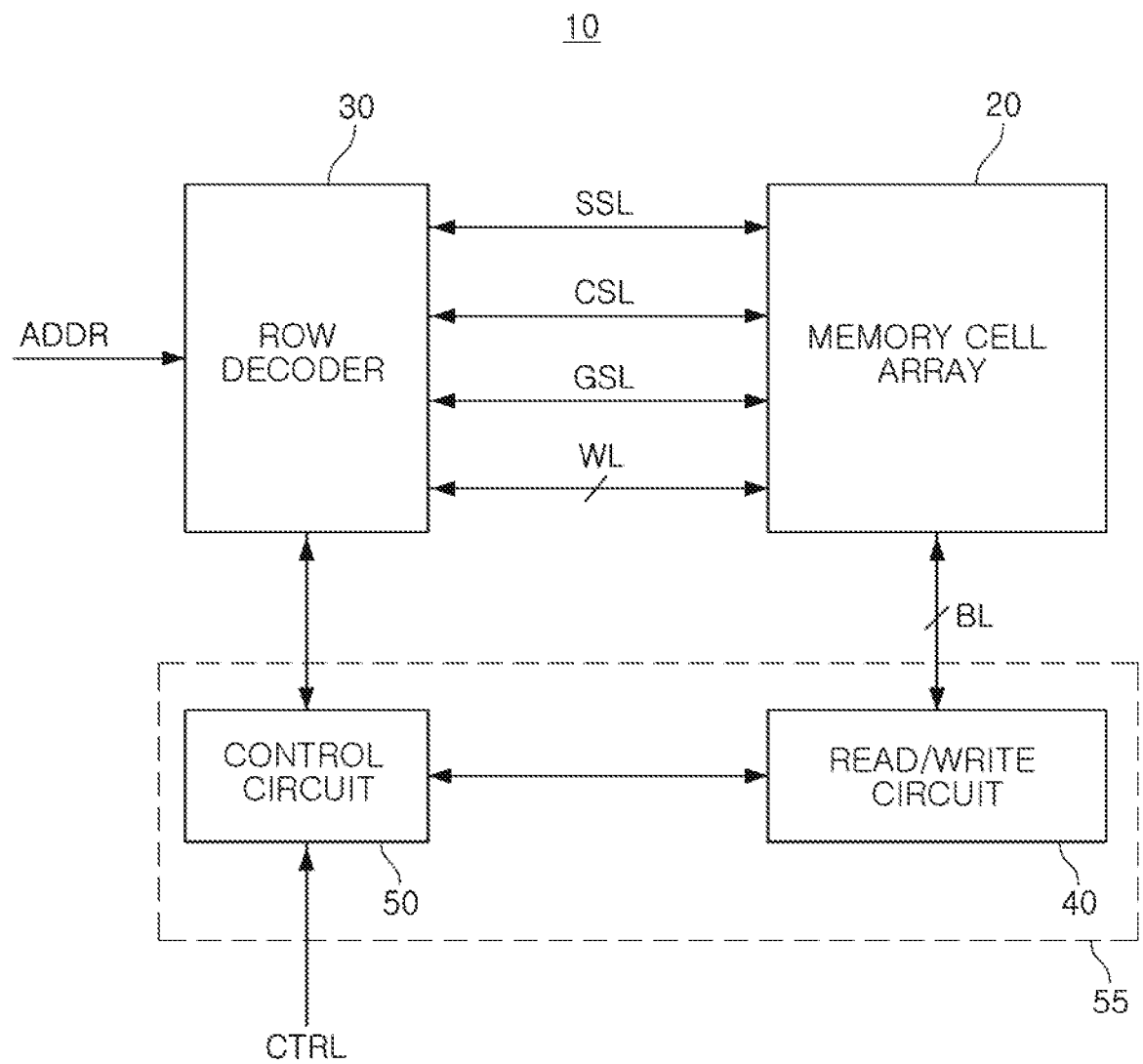
FIG. 1 is a schematic block diagram of a three-dimensional semiconductor memory device according to some embodiments of the present inventive concepts.

FIG. 1 is a schematic block diagram of a three-dimensional semiconductor memory device according to some embodiments of the present inventive concepts.

Referring to FIG. 1, a three-dimensional semiconductor memory device 10 according to some embodiments of the present inventive concepts may include a memory cell array 20, a row decoder 30, and/or a core logic circuit 55. The core logic circuit 55 may include a read/write circuit 40 and/or a control circuit 50.

The memory cell array 20 may include three-dimensionally arranged memory cells. The memory cells included in the memory cell array 20 may be connected to the row decoder 30 through a word line WL, a common source line CSL, a string selection line SSL, a ground selection line GSL, and/or the like, and may be connected to the read/write circuit 40 through a bit line BL. The memory cells included in the memory cell array 20 may be divided into a plurality of memory blocks.

The row decoder 30 may receive an address information ADDR from an external source, and may decode the received address information ADDR to select at least a portion of the word line WL, the common source line CSL, the string selection line SSL, and/or the ground selection line GSL, which are connected to the memory cell array 20.

The read/write circuit 40 may select at least a portion of the bit lines BL connected to the memory cell array 20, in accordance with commands received from the control circuit 50. The read/write circuit 40 may read data stored in a memory cell connected to at least a portion of a selected bit line BL, or may write data into a memory cell connected to at least a portion of a selected bit line BL. The read/write circuit 40 may include circuit such as a page buffer, an input/output buffer, a data latch, and/or the like to perform such operations.

The control circuit 50 may control operations of the row decoder 30 and the read/write circuit 40 in response to a control signal CTRL transmitted from an external source. When data stored in the memory cell array 20 are read, the control circuit 50 may control operation of the row decoder 30 to supply a voltage for a reading operation to the word line WL in which data to be read are stored. When a voltage for a reading operation is supplied to a specific word line WL, the control circuit 50 may control the read/write circuit 40 to read data stored in the memory cell connected to the word line WL to which a voltage for a reading operation is supplied.

Meanwhile, when data is written to the memory cell array 20, the control circuit 50 may control an operation of the row decoder 30 to supply a voltage for a writing operation to the word line WL in which data is to be written. When a voltage for a writing operation is supplied to a specific word line WL, the control circuit 50 may control the read/write circuit 40 to write data into the memory cell connected to the word line WL to which a voltage for a writing operation is supplied.

Figure 2:
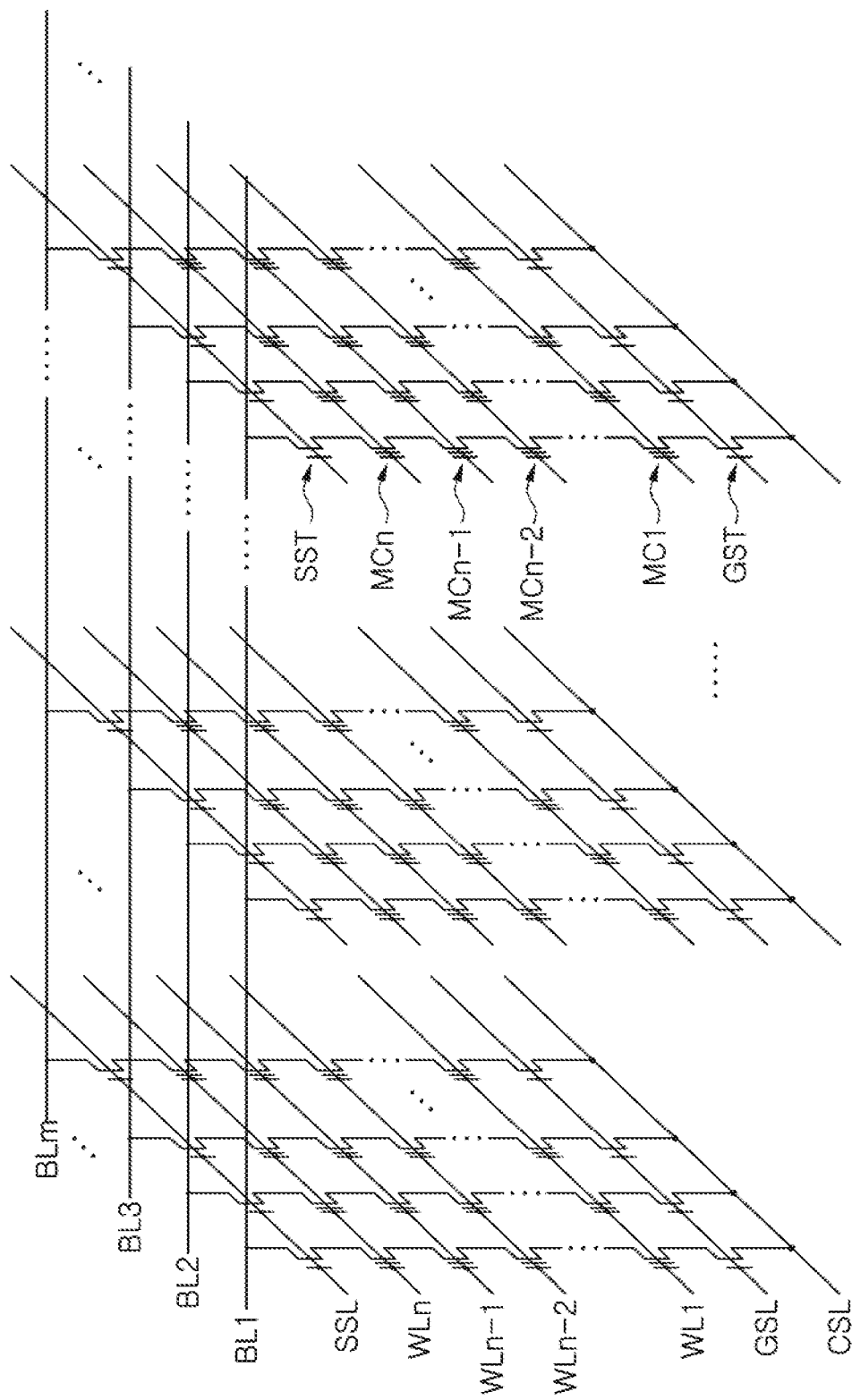
FIG. 2 is a circuit diagram conceptually illustrating a memory cell array region of a three-dimensional semiconductor memory device according to some embodiments of the present inventive concepts.

FIG. 2 is a circuit diagram conceptually illustrating a memory cell array region of a three-dimensional semiconductor memory device according to some embodiments of the present inventive concepts.

Referring to FIG. 2, a memory cell array may include a plurality of string selection transistors, including n memory cell transistors MC1 to MCn connected to each other in series, and a ground selection transistor GST and a string selection transistor SST connected in series to both ends of the memory cell transistors MC1 to MCn.

The n memory cell transistors MC1 to MCn connected to each other in series may be connected to the word lines WL1 to WLn, respectively, for selecting the memory cell transistors MC1 to MCn.

A gate terminal of the ground selection transistor GST may be connected to the ground selection line GSL, and a source terminal of the ground selection transistor GST may be connected to the common source line CSL. A gate terminal of the string selection transistor SST may be connected to the string selection line SSL, and a source terminal of the string selection transistor SST may be connected to a drain terminal of the memory cell transistor MCn. Although FIG. 2 illustrates a structure in which the ground selection transistor GST and the string selection transistor SST are connected to the n memory cell transistors MC1 to MCn connected to each other in series, a plurality of the ground selection transistor GST or a plurality of the string selection transistor SST may be connected to both ends of the n memory cell transistors MC1 to MCn.

The drain terminal of the string selection transistor SST may be connected to bit lines BL1 to BLm. When a signal is applied to the gate terminal of the string selection transistor SST through the string selection line SSL, data read or writing operation may be executed by transmitting signal applied through the bit lines BL1 to BLm to the n memory cell transistors MC1 to MCn connected to each other in series. In addition, by applying a predetermined or alternatively, given, erasing voltage through the substrate, an erasing operation for erasing the data recorded in the memory cells MC1 to MCn may be performed.

Figure 3:
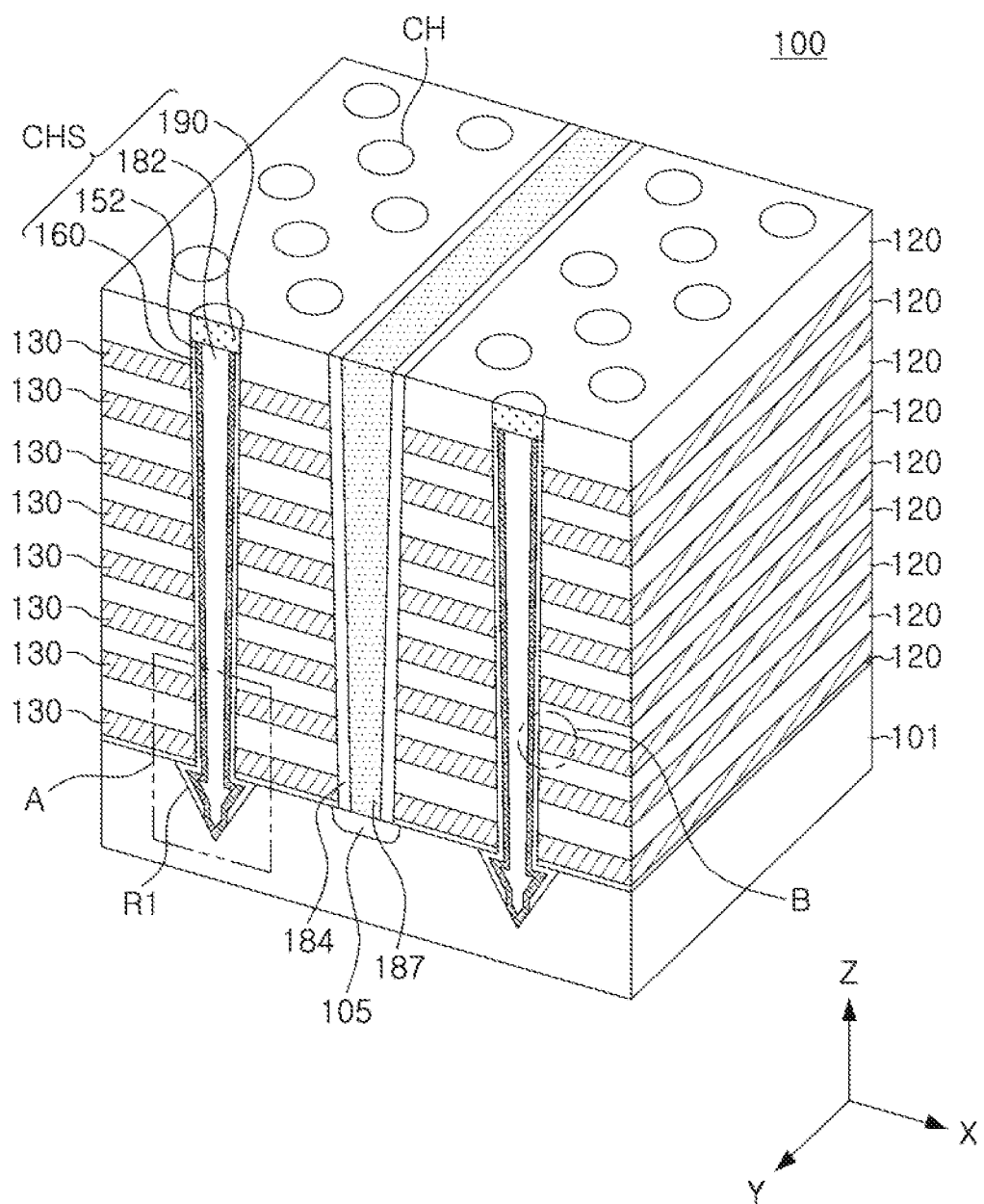
FIG. 3 is a perspective view schematically illustrating a three-dimensional semiconductor memory device according to some embodiments of the present inventive concepts.

FIG. 3 is a perspective view schematically illustrating a three-dimensional semiconductor memory device according to some embodiments of the present inventive concepts.

Referring to FIG. 3, a three-dimensional semiconductor memory device 100 may include a substrate 101, channel structures CHS extending in a direction perpendicular to an upper surface of the substrate 101, and/or mold insulation layers 120 and gate electrodes 130 alternately stacked along a sidewall of the channel structures CHS. The three-dimensional semiconductor memory device 100 further may include a conductive layer 187 for dividing the gate electrodes 130, and an impurity region 105 disposed in the substrate 101 under the conductive layer 187.

The channel structures CHS may be arranged in channel holes CH that pass through the mold insulation layers 120 and the gate electrodes 130 alternately stacked on the substrate 101 in a direction perpendicular to an upper surface of the substrate 101. The channel holes CH may be formed such that the diameters of the channel holes CH become narrower toward the substrate 101. The channel structures CHS may be inserted into recesses R1 disposed in the upper portion of the substrate 101, respectively. A width of the channel structures CHS may gradually decrease toward the substrate 101, and may increase in the upper portion of the substrate 101. A width of an upper region of the channel structures CHS passing through the mold insulation layers 120 and the gate electrodes 130 are gradually narrower toward the substrate 101, while a lower region of the channel structures CHS inserted into the upper portion of the substrate 101 may have the widest width in the same position as the upper surface of the substrate 101, and a width thereof may be gradually narrower away from the upper surface of the substrate 101.

Each of the channel structures CHS may include a channel layer 152, a gate dielectric layer 160 disposed between the channel layer 152 and the gate electrodes 130, a first insulation layer 182 disposed in the channel layer 152, and/or a conductive pad 190 disposed at an upper end of the channel layer 152. The channel structures CHS may be spaced apart from each other in X and Y directions, and may be arranged in a zigzag manner.

In the three-dimensional semiconductor memory device 100, one memory cell string may be formed along one channel structure CHS. The three-dimensional semiconductor memory device 100 may include a plurality of memory cell strings arranged in a zigzag manner in the X and Y directions.

The substrate 101 may have an upper surface extending in the X and Y directions. The substrate 101 may include a semiconductor material, such as a Group IV semiconductor, a Group III-V compound semiconductor, or a Group II-VI compound semiconductor. For example, a Group IV semiconductor may include silicon, germanium, or silicon-germanium.

The mold insulation layers 120 and the gate electrodes 130 may be alternately stacked on the substrate 101. The gate electrodes 130 may be disposed to be spaced apart from the substrate 101 alongside surfaces of the channel structures CHS in the Z direction. The gate electrodes 130 may form a ground selection line GLS, word lines WL1 to WLn, and a string selection line SSL (see FIG. 2). In FIG. 3, eight of the gate electrodes 130 are illustrated as being stacked, but the present inventive concepts are not limited thereto. The number of the gate electrodes 130 may be determined according to a memory capacity of the three-dimensional semiconductor memory device 100. For example, the number of the gate electrodes 130 may be several tens to several hundreds.

A lowermost gate electrode of the gate electrodes 130 may form a ground selection line GSL. An uppermost gate electrode of the gate electrodes 130 may form a string selection line SSL. Remaining gate electrodes of the gate electrodes 130 may form the word lines WL.

The gate electrodes 130 may include a metal layer and a barrier layer. The metal layer may include, for example, tungsten (W). The barrier layer may be disposed to surround the metal layer, and may include at least one of tungsten nitride (WN), tantalum nitride (TaN), and titanium nitride (TiN). In some embodiments, the gate electrodes 130 may include a metal silicide material or doped polycrystalline silicon. The metal silicide material may include, for example, Si and at least one of Co, Ni, Hf, Pt, W, and Ti.

The mold insulation layers 120 may be disposed between the substrate 101 and the gate electrode 130, and on the gate electrodes 130. The mold insulation layers 120 may be disposed to be spaced apart from the substrate 101 along the side surfaces of the channel structures CHS in the Z direction, in a similar manner to the gate electrodes 130. The mold insulation layers 120 may include an insulating material such as silicon oxide or silicon nitride.

The channel layer 152 and the gate dielectric layer 160 may pass through the gate electrodes 130 and the mold insulation layers 120, and may extend in a direction (a Z direction) substantially perpendicular to the upper surface of the substrate 101.

The channel layer 152 may include a semiconductor material such as polycrystalline silicon or monocrystalline silicon, and the semiconductor material may be undoped, or including p-type or n-type impurities.

The conductive pad 190 may be disposed to cover an upper surface of the first insulation layer 182, and electrically connect to the channel layer 152. The conductive pad 190 may include, for example, doped polycrystalline silicon. The conductive pad 190 may serve as a drain region of the string selection transistor SST (see FIG. 2). The conductive pad 190 may be electrically connected to the bit line through a contact plug.

The impurity regions 105 may be arranged at predetermined or, alternatively, desired intervals in the X direction while extending in the Y direction adjacent to the upper surface of the substrate 101. The impurity region 105 may serve as a source region of the ground selection transistors GST (see FIG. 2).

The conductive layers 187 may be arranged on the impurity region 105 at predetermined or, alternatively, desired intervals in the X direction while extending along the impurity region 105 in the Y direction. The conductive layer 187 may include a conductive material. For example, the conductive layer 187 may include tungsten (W), aluminum (Al), or copper (Cu). The conductive layer 187 may be electrically isolated from the gate electrodes 130 by a second insulation layer 184.

FIGS. 4A to 4F are cross-sectional views schematically illustrating a portion (region A in FIG. 3) of a three-dimensional semiconductor memory device according to some embodiments of the present inventive concepts.

Figure 4A:
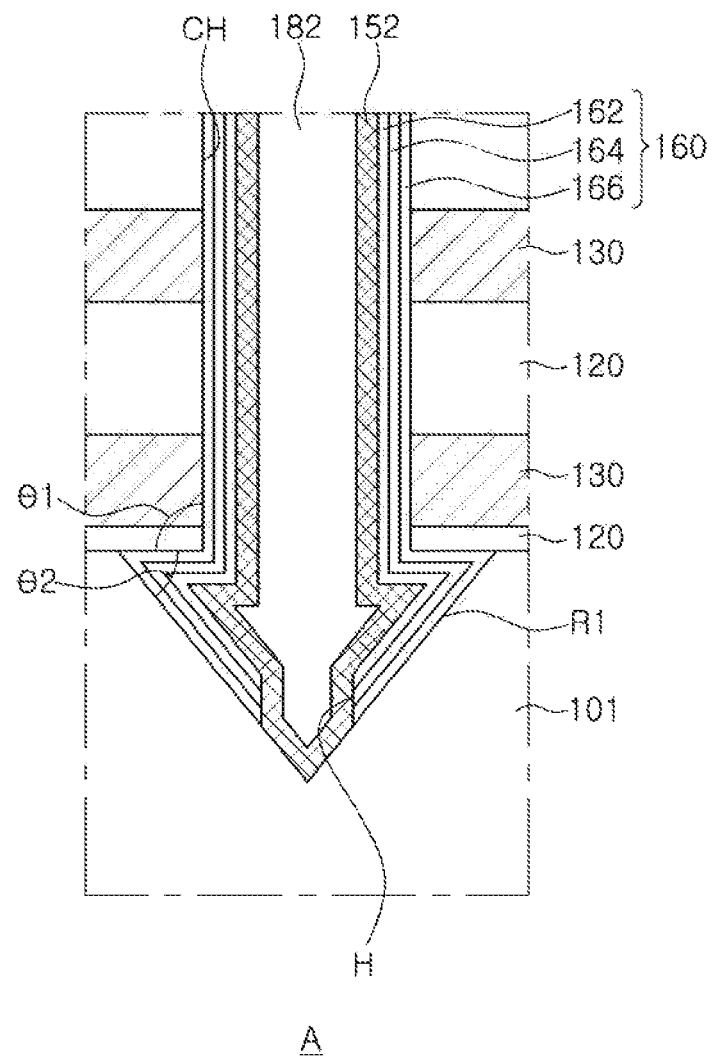
FIGS. 4A to 4F are cross-sectional views schematically illustrating a portion (region A in FIG. 3) of a three-dimensional semiconductor memory device according to some embodiments of the present inventive concepts.

Referring to FIG. 4A, a channel layer 152 and a gate dielectric layer 160 disposed in a channel hole CH may pass through gate electrodes 130 and mold insulation layers 120, and may extend in a direction (a Z direction) substantially perpendicular to an upper surface of a substrate 101. The channel layer 152 and the gate dielectric layer 160 may be formed in a recess R1 of the substrate 101. At least a portion of the recess R1 may have a width wider than a width of a lower portion of the channel hole CH. For example, a width of an upper portion of the recess R1 may be wider than a width of a lower portion of the channel hole CH. The recess R1 may have an inverted pyramid shape having the largest width on the upper surface of the substrate 101. A surface of the channel structure CHS (see FIG. 3) found in the recess R1' may comprise inclined surfaces with respect to the upper surface of the substrate.

The gate dielectric layer 160 may conformally cover a surface of the recess R1, and may have an opening H in the recess R1, and the channel layer 152 may contact the substrate 101 through an opening H of the gate dielectric layer 160.

The gate dielectric layer 160 may be bent at a first angle $\theta 1$ and extend under the mold insulation layers 120 in the upper portion of the substrate 101. The gate dielectric layer 160 may contact a lower surface of a lowermost mold insulation layer 120 that may be in contact with the substrate 101, among the mold insulation layers 120. The gate dielectric layer 160 may include a tunneling layer 162, an electric charge storage layer 164, and a blocking layer 166 that are sequentially stacked from the channel layer 150. The blocking layer 166 in the gate dielectric layer 160 may contact a lower surface of the lowermost mold insulation layer 120 in contact with the substrate 101 among the mold insulation layers 120.

The channel layer 152 may also be bent along the gate dielectric layer 160 at a first angle $\theta 1$ and extend under the mold insulation layers 120 in the upper portion of the substrate 101. The first angle $\theta 1$ may be 90 degrees or less.

The gate dielectric layer 160 and the channel layer 152 may be bent toward a lower surface of the substrate 101 at a second angle $\theta 2$ again. The second angle $\theta 2$ may be less than 90 degrees. The second angle $\theta 2$ may be equal to, for example, an angle formed by a {100} crystal plane and a {111} crystal plane of a diamond crystal structure.

A portion of the gate dielectric layer 160 inserted into the upper portion of the substrate 101 may have inclined surfaces contacting the upper portion of the substrate 101.

In some embodiments, a thickness of the channel layer 152 may be further thicker, and an opening H of the gate dielectric layer 160 may be filled with the channel layer 152.

Figure 4B:
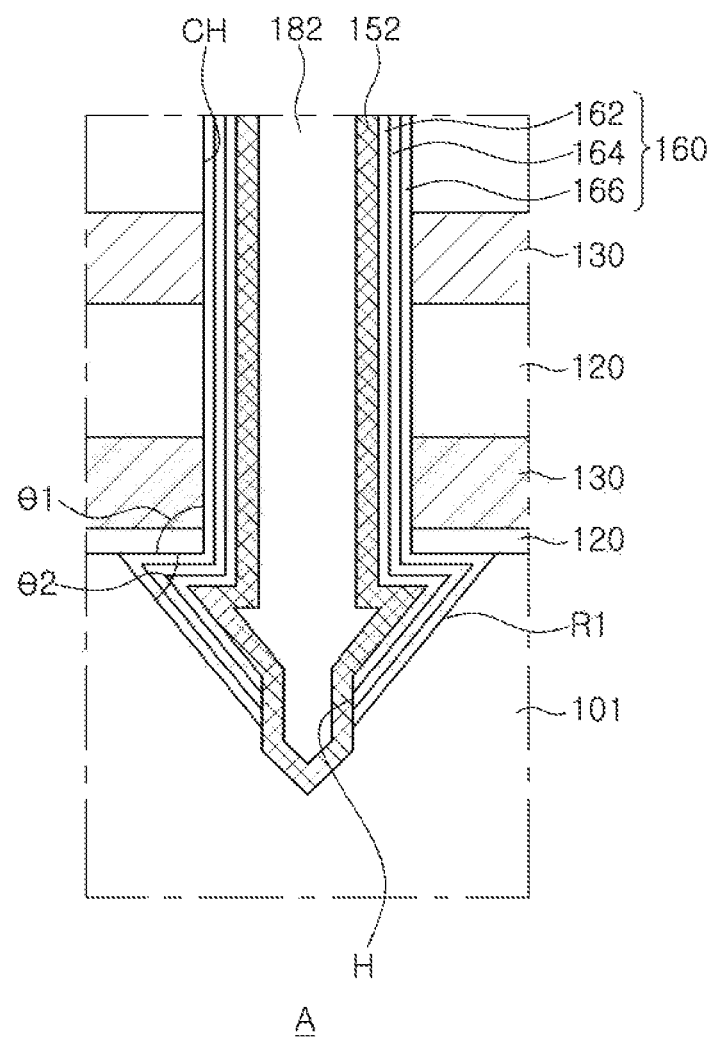

Referring to FIG. 4B, in a different manner to FIG. 4A, a lower end of a channel layer 152 contacting a substrate 101 may protrude from a gate dielectric layer 160 to form a stepped shape.

Figure 4C:
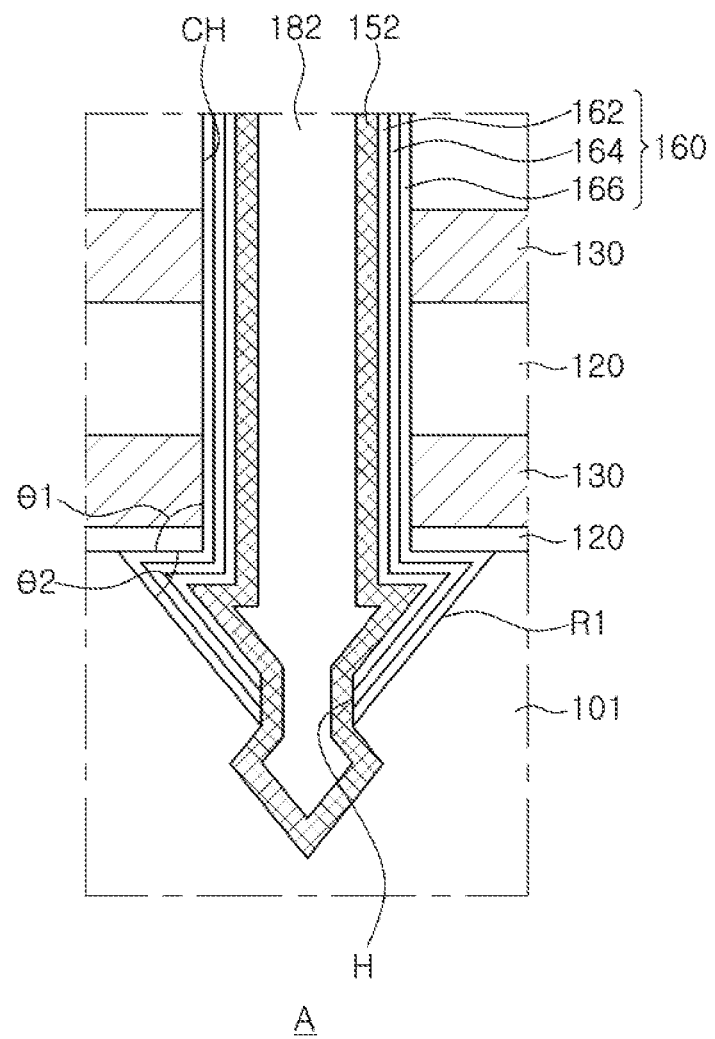

Referring to FIG. 4C, in a different manner to FIG. 4A, a channel layer 152 may have an end portion further protruding from a lower end of a gate dielectric layer 160 in a downward direction, and the end portion may include inclined surfaces with respect to an upper surface of a substrate 101. An angle formed by the inclined surfaces with respect to the upper surface of the substrate 101 may be equal to an angle formed by a {100} crystal plane and a {111} crystal plane of a diamond crystal structure. At least a portion of the end portion may have a width wider than a width of an opening H of the gate dielectric layer 160.

Figure 4D:
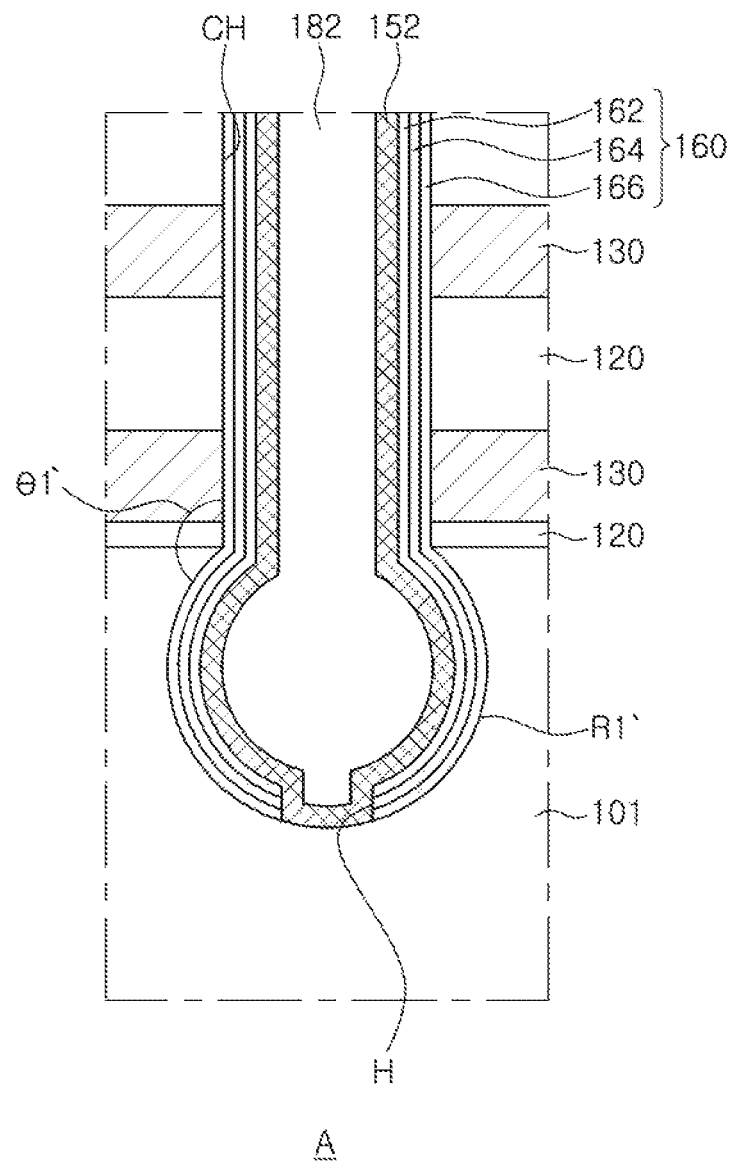

Referring to FIG. 4D, a channel layer 152 and a gate dielectric layer 160 disposed in a channel hole CH may pass through gate electrodes 130 and mold insulation layers 120, and may extend in a direction (a Z direction) substantially perpendicular to an upper surface of a substrate 101. The channel layer 152 and the gate dielectric layer 160 may be formed in a recess R1' of the substrate 101. At least a portion of the recess R1' may have a width wider than a width of a lower portion of the channel hole CH. The recess R1' may be a spherical shape having a diameter longer than a width of the channel hole CH. A surface of the channel structure CHS (see FIG. 3) inserted into the recess R1' may have a curved surface or a spherical surface.

The gate dielectric layer 160 may conformally cover a surface of the recess R1', and may have an opening H in the recess R1', and the channel layer 152 may cover the gate dielectric layer 160, and may contact the substrate 101 through the opening H of the gate dielectric layer 160.

The gate dielectric layer 160 may be bent at a first angle θ1' and extend under the mold insulation layers 120 in an upper portion of the substrate 101. A portion of the gate dielectric layer 160 inserted into the upper portion of the substrate 101 may have a convex curved surface or spherical surface contacting the upper portion of the substrate 101. A surface of the gate dielectric layer 160 covering the surface of the recess R1' may have a curved surface or a spherical surface. The gate dielectric layer 160 may include a tunneling layer 162, an electric charge storage layer 164, and a blocking layer 166 that are sequentially stacked from the channel layer 150.

The channel layer 152 may also be bent along the gate dielectric layer 160 at a first angle θ1' and extend under the mold insulation layers 120 in the upper portion of the substrate 101. The first angle θ1' may be greater than 90 degrees.

In some embodiments, a thickness of the channel layer 152 may be further thicker, and an opening H of the gate dielectric layer 160 may be filled with the channel layer 152.

Figure 4E:
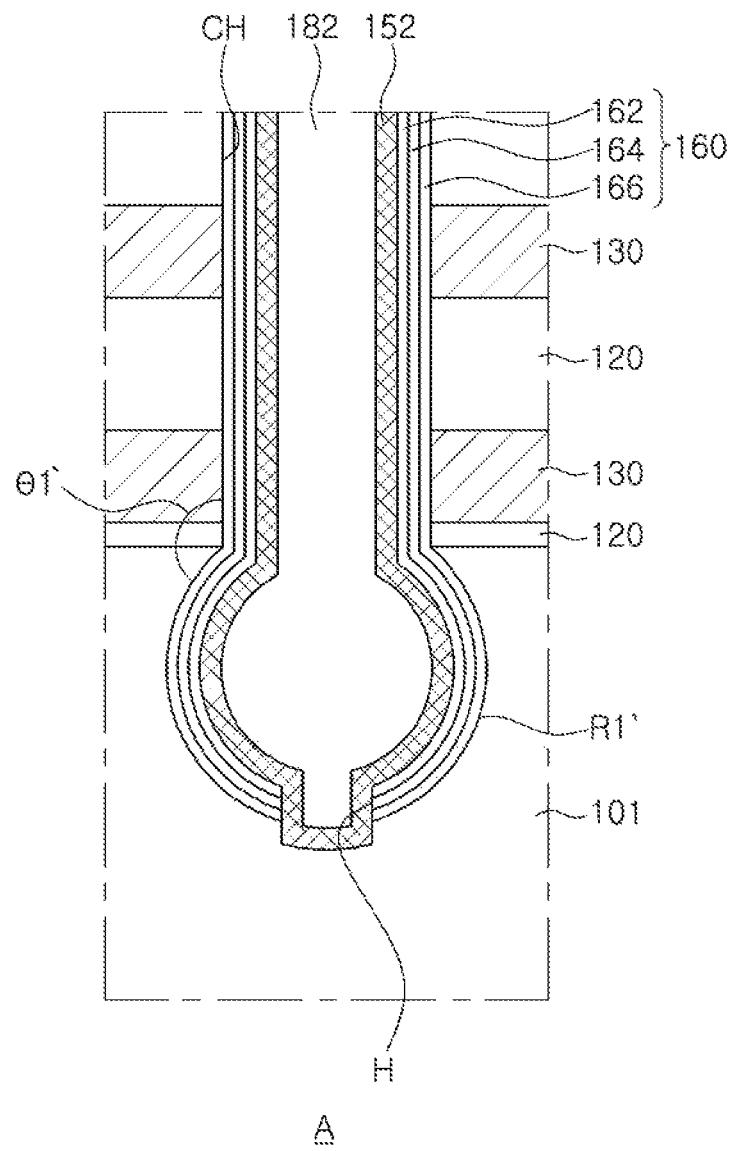

Referring to FIG. 4E, in a different manner to FIG. 4C, a lower end of a channel layer 152 contacting a substrate 101 may protrude from the gate dielectric layer 160 to form a stepped shape.

Figure 4F:
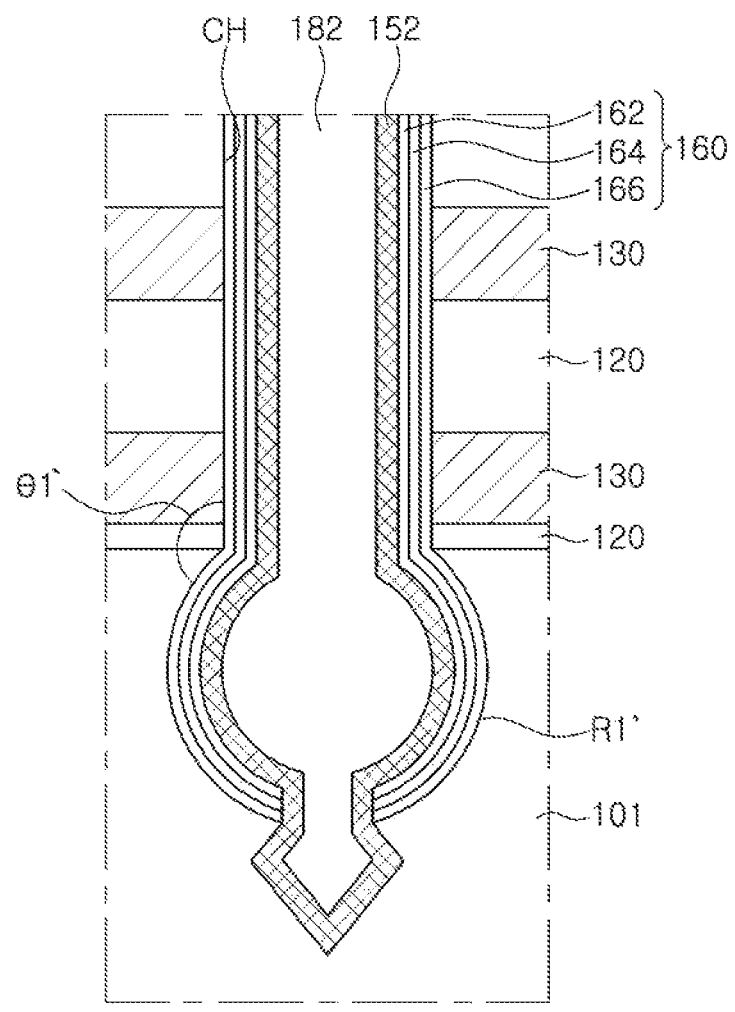

Referring to FIG. 4F, in a different manner to FIG. 4C, a channel layer 152 may have an end portion further protruding from a lower end of a gate dielectric layer 160 in a downward direction, and the end portion may include inclined surfaces with respect to an upper surface of a substrate 101. An angle formed by the inclined surfaces with respect to the upper surface of the substrate 101 may be equal to an angle formed by a {100} crystal plane and a {111} crystal plane of a diamond crystal structure. At least a portion of the end portion may have a width wider than a width of an opening H of the gate dielectric layer 160.

Figure 5A:
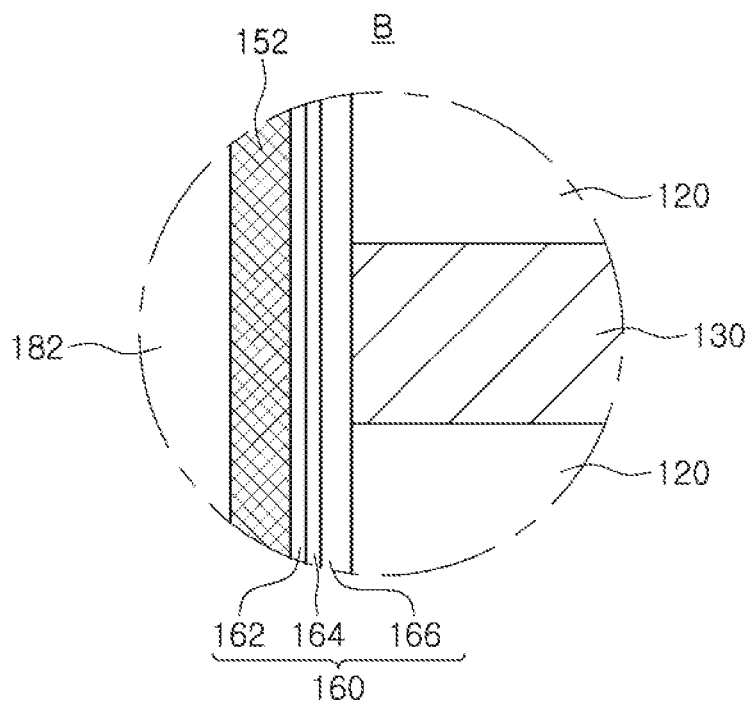
FIGS. 5A and 5B are cross-sectional views schematically illustrating a portion (region B in FIG. 3) of a three-dimensional semiconductor memory device according to some embodiments of the present inventive concepts.
Figure 5B:
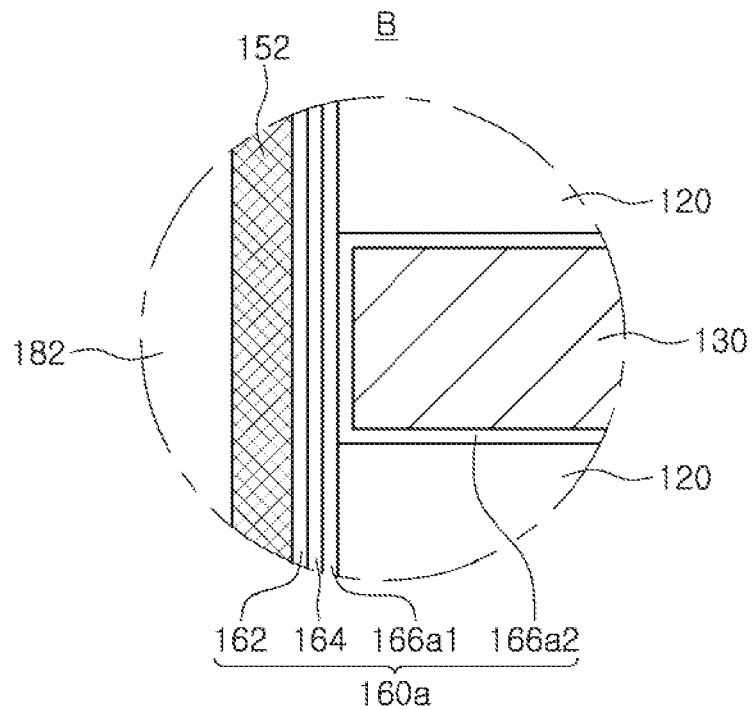

FIGS. 5A and 5B are cross-sectional views schematically illustrating a portion (region B in FIG. 3) of a three-dimensional semiconductor memory device according to some embodiments of the present inventive concepts.

Referring to FIG. 5A, a gate dielectric layer 160 disposed along sidewalls of channel holes CH through gate electrodes 130 and mold insulation layers 120 may include a tunneling layer 162, an electric charge storage layer 164, and a blocking layer 166, that are sequentially stacked from the channel layer 150. The gate dielectric layer 160 of some embodiments may be arranged such that the tunneling layer 162, the electric charge storage layer 164, and the blocking layer 166 all extend along the channel layer 150 in a vertical direction. A relative thicknesses of the layers constituting the gate dielectric layer 160 are not limited to those illustrated in the drawings, and may be variously changed.

The tunneling layer 162 may include, for example, silicon oxide. The electric charge storage layer 164 may be an electric charge trap layer or a floating gate conductive layer. For example, the electric charge storage layer 164 may be an electric charge trap layer including silicon nitride. For example, the electric charge storage layer 164 may include quantum dots or nanocrystals. In this case, the quantum dots or nanocrystals may be composed of fine particles of a conductor, for example, a metal or a semiconductor. The blocking layer 166 may include silicon oxide ($SiO_2$), silicon nitride ($Si_3N_4$), silicon oxynitride (SiON), high dielectric constant (high-k) material, or a combination thereof. The high dielectric constant material may be at least one selected from aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

Referring to FIG. 5B, in a different manner to FIG. 5A, a gate dielectric layer 160a may have a stacked structure including a tunneling layer 162, an electric charge storage layer 164, and blocking layers 166a1 and 166a2, sequentially stacked from a channel layer 152. Relative thicknesses of the layers constituting the gate dielectric layer 160a are not limited to those illustrated in the drawings, and may be variously changed.

The gate dielectric layer 160a, in a different manner to the embodiment of FIG. 5A, may include the two blocking layers 166a1 and 166a2, in which the first blocking layer 166a1 may extend along the channel layer 152 in a vertical direction, and the second blocking layer 166a2 may be disposed to surround a gate electrode 130. For example, the second blocking layer 166a2 may include a material having a higher dielectric constant than the first blocking layer 166a1.

FIGS. 6A to 6J are cross-sectional views schematically illustrating a method of manufacturing a three-dimensional semiconductor memory device according to some embodiments of the present inventive concepts. FIGS. 6A to 6J may illustrate a region corresponding to an X-Z cross section in the perspective view of FIG. 3.

Figure 6A:
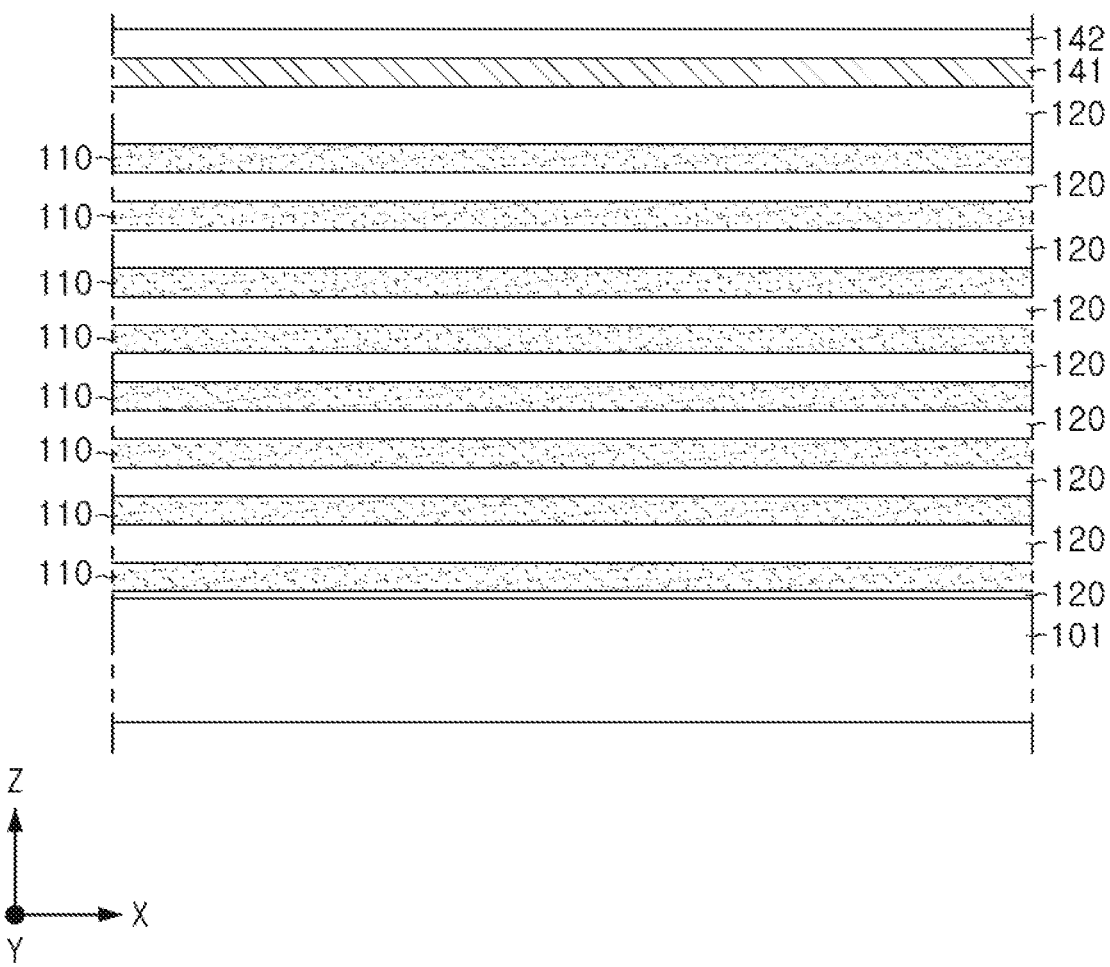
FIGS. 6A to 6J are cross-sectional views schematically illustrating a method of manufacturing a three-dimensional semiconductor memory device according to some embodiments of the present inventive concepts.

Referring to FIG. 6A, sacrificial layers 110 and mold insulation layers 120 may be alternately stacked on a substrate 101. The mold insulation layers 120 and the sacrificial layers 110 may be alternately stacked on the substrate 101, starting from the mold insulation layer 120, as illustrated. In addition, a buffer layer 141 and a mask layer 142 may be further formed on an uppermost mold insulation layer of the mold insulation layers 120.

The sacrificial layers 110 may be formed of a material that may be etched with etch selectivity to the mold insulation layers 120. For example, the mold insulation layers 120 may be made of at least one of silicon oxide and silicon nitride, and the sacrificial layers 110 may be formed of a different material from the mold insulation layers, that is, formed of a material selected from silicon, silicon oxide, silicon carbide, and silicon nitride.

As illustrated, thicknesses of the mold insulation layers 120 in some embodiments may not be equal to each other. A lowermost mold insulation layer of the mold insulation layers 120 may be formed to be relatively thin, and an uppermost mold insulation layer of the mold insulation layers 120 may be formed to be relatively thick. Thicknesses of the mold insulation layers 120 and the sacrificial layers 110 may be variously modified, in a different manner to those illustrated, and the number of the mold insulation layers 120 and the sacrificial layers 110 may also be variously changed.

The buffer layer 141 may include a silicon oxynitride film or a silicon nitride film, and may be used as a stopping layer in a planarization process (for example, a CMP process) to be performed later. A mask layer 142 may be formed on the buffer layer 141. The mask layer 142 may be used as a hard mask in an etching process to be subsequently performed. The mask layer 142 may include a silicon oxide film.

Figure 6B:
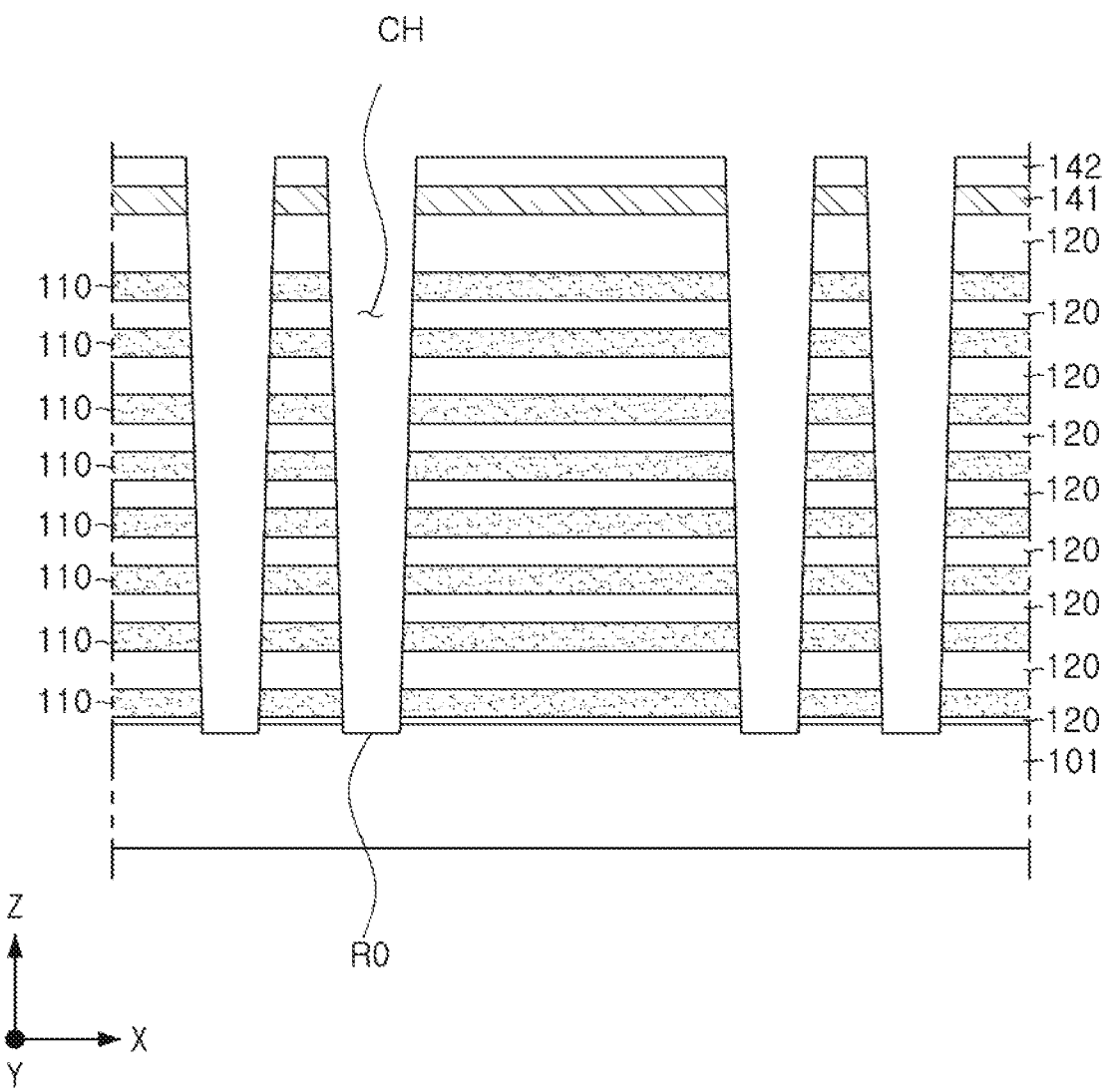

Referring to FIG. 6B, channel holes CH passing through the sacrificial layers 110 and the mold insulation layers 120 may be formed.

The mask layer 142 may be patterned, and the buffer layer 141, the sacrificial layers 110 and the mold insulation layers 120 may be anisotropically dry etched by using the patterned mask layer 142 as an etch mask, to form the channel holes CH. The channel holes CH may extend to the substrate 101 in a Z direction, and preliminary recess regions R0 may be formed in an upper portion of the substrate 101 exposed by the channel holes CH. Sidewalls of the channel holes CH may not be perpendicular to an upper surface of the substrate 101. For example, a diameter of the channel holes CH may be reduced toward the upper surface of the substrate 101. As an aspect ratio of the channel holes CH increases, a phenomenon of reduction in diameter of the channel holes CH may be further exacerbated. A width (or a diameter) of an upper portion of the channel holes CH may be larger than a width (or a diameter) of a lower portion of the channel holes CH.

Figure 6C:
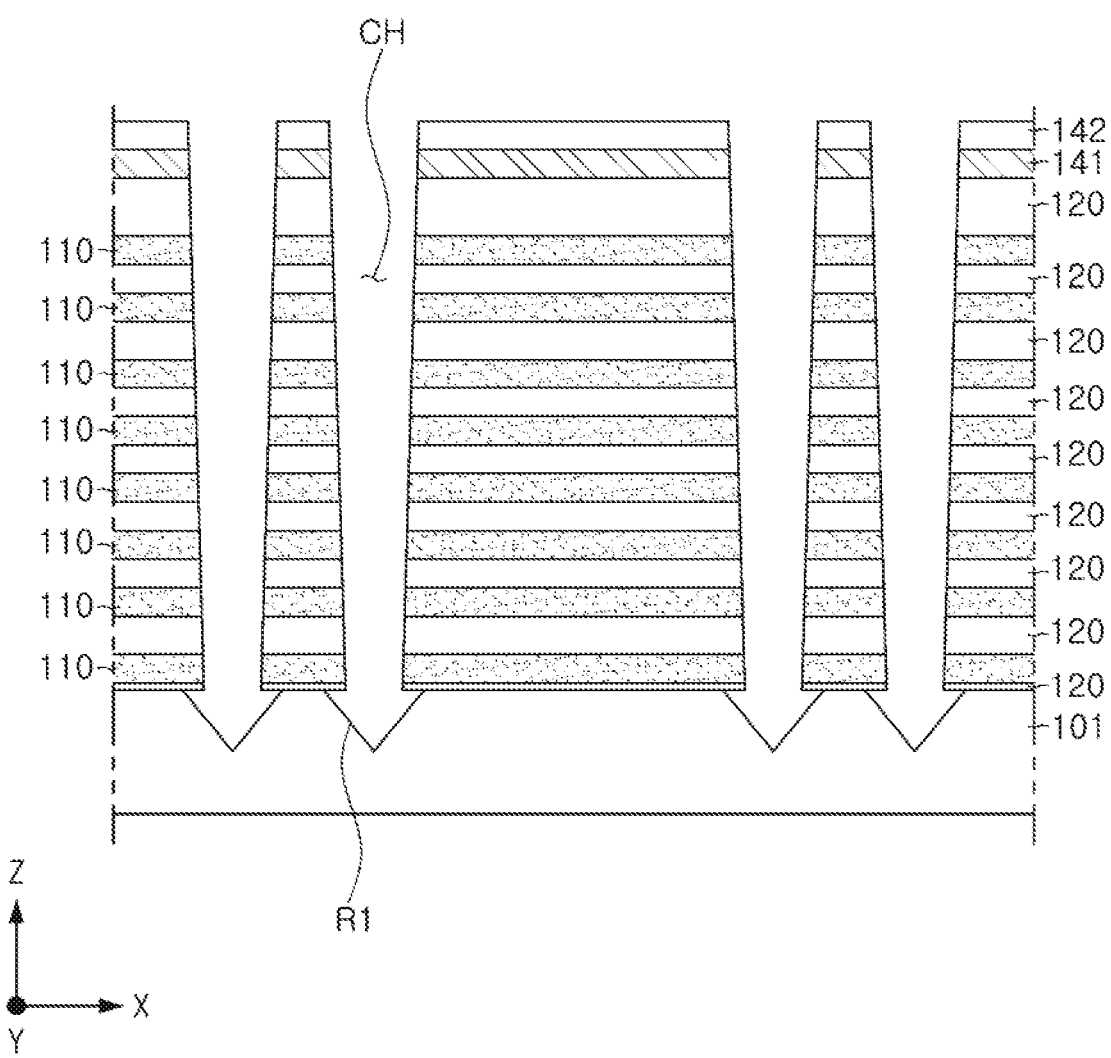

Referring to FIG. 6C, recesses R1 may be formed in the upper portion of the substrate 101 exposed by the channel holes CH.

The recesses R1 may be removed by an anisotropic wet etching process. The anisotropic wet etching process may be performed using a basic solution including NH$_4$OH, NaOH, or KOH. By the anisotropic wet etching process, the recesses R1 may extend under the mold insulation layer 121 in a horizontal direction, and may be deepened in a vertical direction. The recesses R1 may be formed with inclined surfaces having a certain angle of inclination with respect to the upper surface of the substrate 101. The recesses R1 may have an inverted pyramid shape. The recesses R1 may have a V-shaped cross-section. The inclined surfaces may correspond to a {111} crystal plane of the diamond crystal structure. An angle formed by the inclined surfaces with respect to the upper surface of the substrate 101 may be identical to an angle formed by a {100} crystal plane and a {111} crystal plane of the diamond crystal structure. The recesses R1 may have a lowermost point in the center of the channel holes CH. A width of the upper portion of the recesses R1 may be larger than a diameter of the lower portion of the channel holes CH.

Figure 6D:
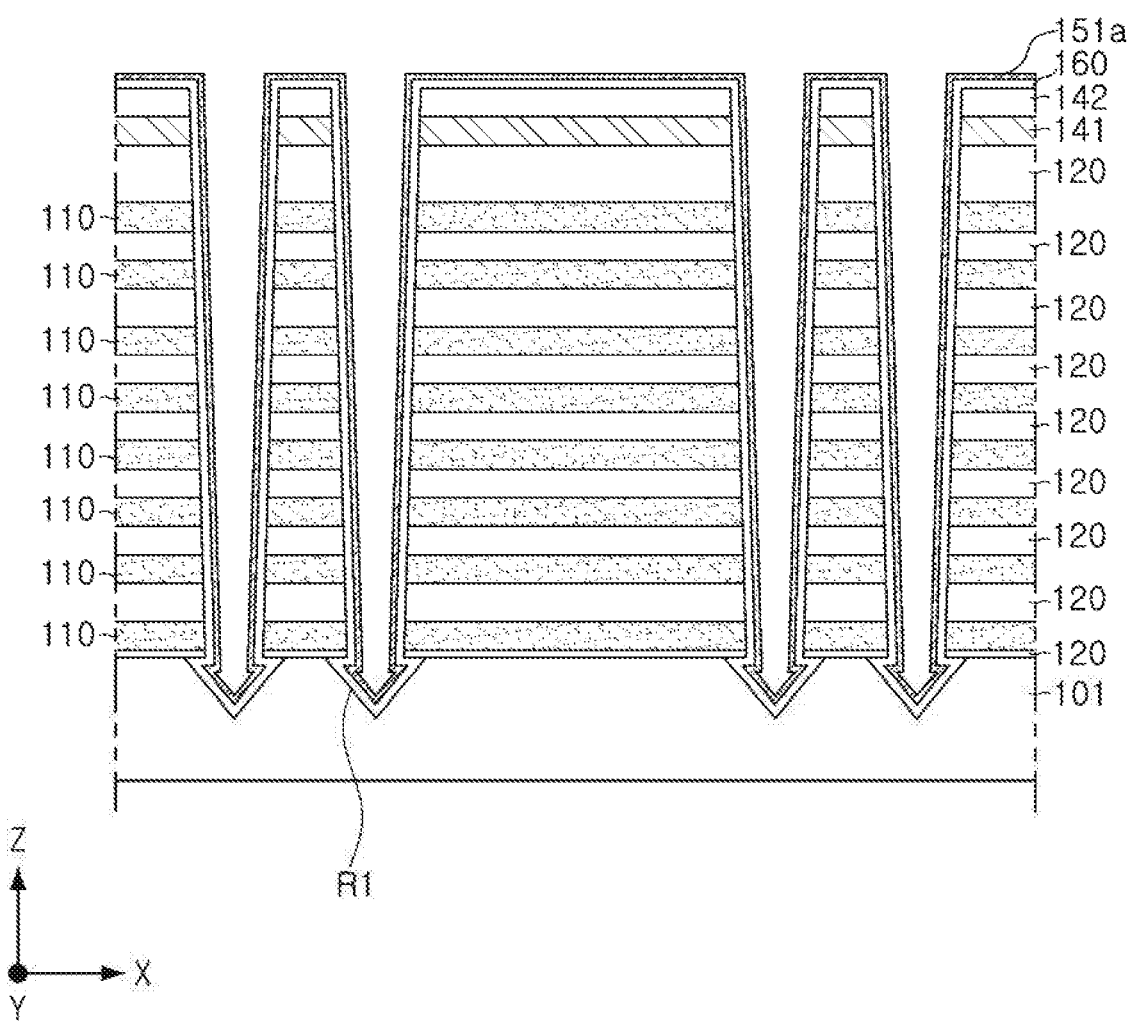

Referring to FIG. 6D, a gate dielectric layer 160 and a sacrificial semiconductor film 151a may be formed in the channel holes CH.

The gate dielectric layer 160 may be conformally formed on the sidewalls of the channel holes CH, the surface of the recesses R1, and/or the upper surface of the mask layer 142.

The gate dielectric layer 160 may include a blocking layer, an electric charge storage layer, and/or a tunneling layer, which are formed in sequence.

The sacrificial semiconductor film 151a may be formed conformally on the gate dielectric layer 160. The sacrificial semiconductor film 151a may be made of a semiconductor material such as polycrystalline silicon or amorphous silicon. For example, the sacrificial semiconductor film 151a may be polycrystalline silicon.

The gate dielectric layer 160 and the sacrificial semiconductor film 151a may be formed by an atomic layer deposition (ALD) process or a chemical vapor deposition (CVD) process.

The gate dielectric layer 160 and the sacrificial semiconductor film 151a may extend along the sidewalls of the channel holes CH in the vertical direction, and may be bent at the boundary between the channel holes CH and the recesses R1 in the horizontal direction. The gate dielectric layer 160 and the channel layer 152 may be bent toward a lower surface of the substrate 101 at a second angle θ2 again.

Figure 6E:
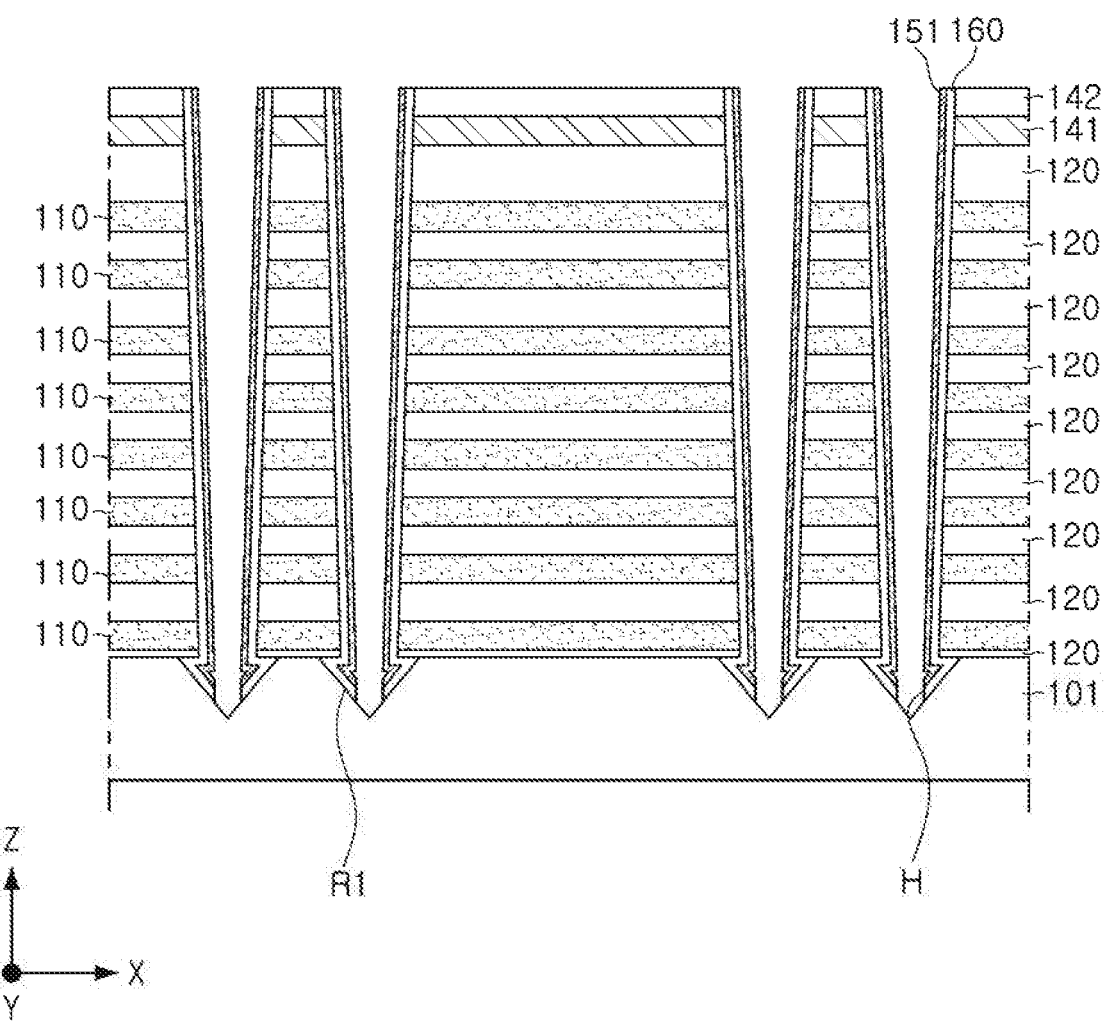

Referring to FIG. 6E, a portion of the gate dielectric layer 160 on the recesses R1 may be removed.

The sacrificial semiconductor layer 151a may be anisotropically etched to form sacrificial spacer layers 151 in the channel holes CH. The sacrificial spacer layers 151 may cover the gate dielectric layer 160 in the channel holes CH, and may expose a portion of the gate dielectric layer 160 formed in the recesses R1.

The sacrificial spacer layer 151 may be used as an etch mask to anisotropically etch, and selectively remove the exposed gate dielectric layer 160.

In some embodiments, when the gate dielectric layer 160 is etched, a portion of the substrate 101 located in a position lower than a position of the gate dielectric layer 160 may also be etched.

Figure 6F:
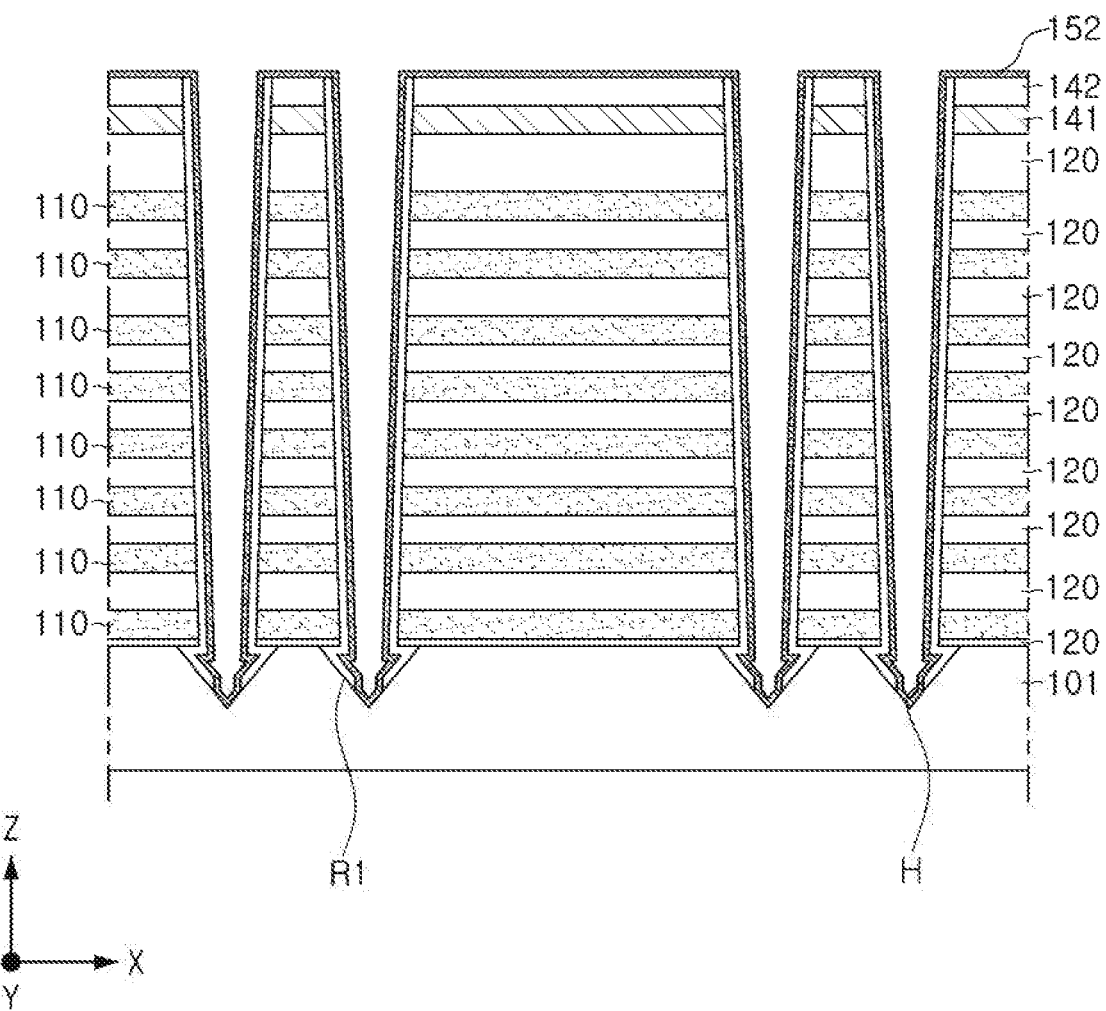

Referring to FIG. 6F, the sacrificial spacer layer 151 may be removed, and a channel layer 152 may be formed in the channel holes CH and the recesses R1.

The sacrificial spacer layer 151 may be removed by a dry etch process or a wet etch process.

The channel layer 152 may be conformally formed using an atomic layer deposition (ALD) or a chemical vapor deposition (CVD) on the gate dielectric layer 160. The channel layer 152 may be made of a semiconductor material such as polycrystalline silicon or amorphous silicon. The channel layer 152 may cover a surface of the recess R1 of the exposed substrate 101 from which the gate dielectric layer 160 is removed.

When the channel layer 152 is made of polycrystalline silicon, the channel layer 152 may be formed to be thicker than the desired thickness, and may be adjusted to the desired thickness through a trimming process, to prevent breakage of the channel layer 152. The trimming process may be precisely performed using a solution such as an SC1 solution.

In some embodiments, the sacrificial spacer layer 151 may be removed by an anisotropic wet etch process. The anisotropic wet etching process may be performed using a basic solution including NH$_4$OH, NaOH, or KOH.

In some embodiments, the sacrificial space layer 151 may not be removed.

Figure 6G:
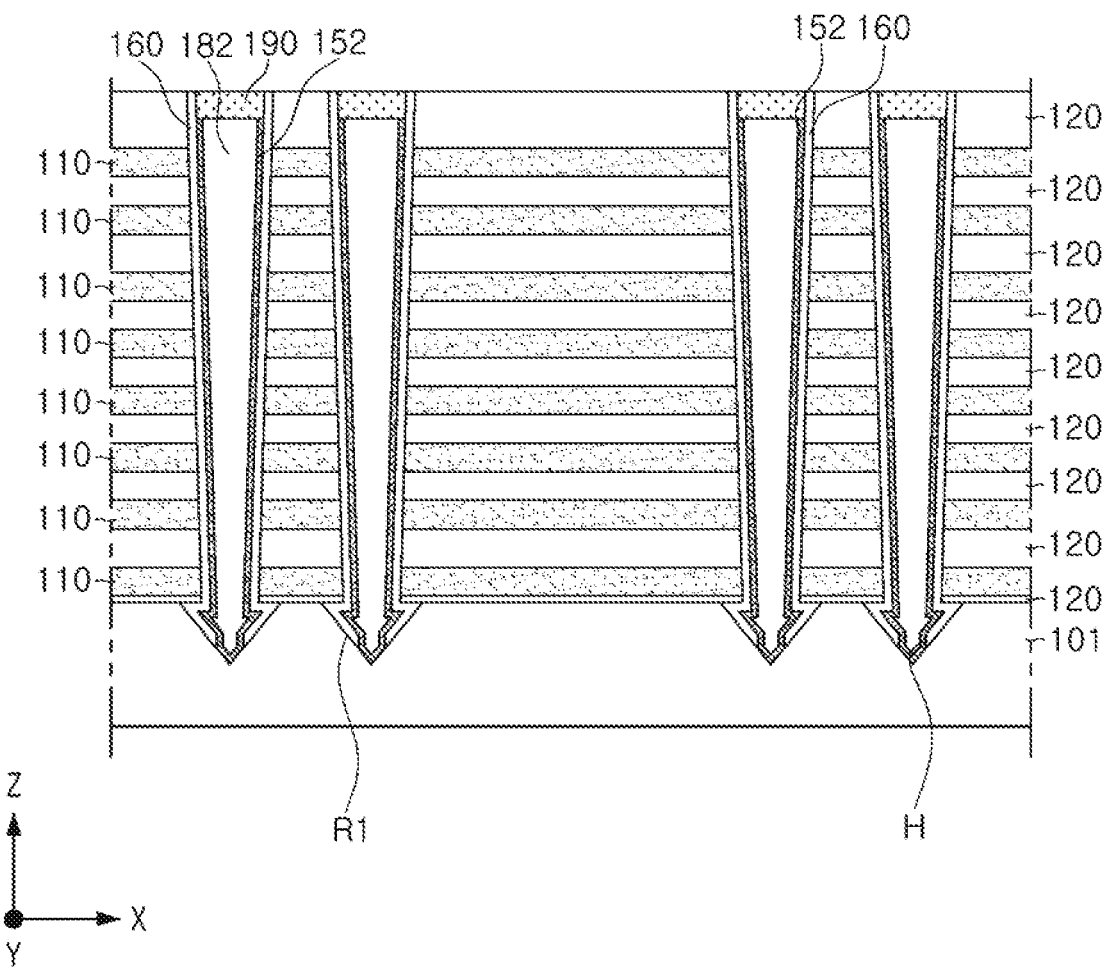

Referring to FIG. 6G, first insulation layers 182 filling the channel holes CH and conductive pads 190 on the first insulation layers 182 may be formed.

After forming the channel layer 152, a first insulation layer 182 filling the remaining space of the channel holes CH may be formed.

A portion of the first insulation layer 182 may be etched in an upper region of the channel holes CH to form a space in which the conductive pads 190 are disposed. A semiconductor material may be covered to fill the space, and then the conductive pads 190 may be formed by performing a planarization process such that an uppermost mold insulation layer 129 is exposed. At this time, the buffer layer 141 and the mask layer 142 may be removed.

The first insulation layer 182 may be an insulating material such as silicon oxide. The conductive pad 190 may be a doped semiconductor material.

Figure 6H:
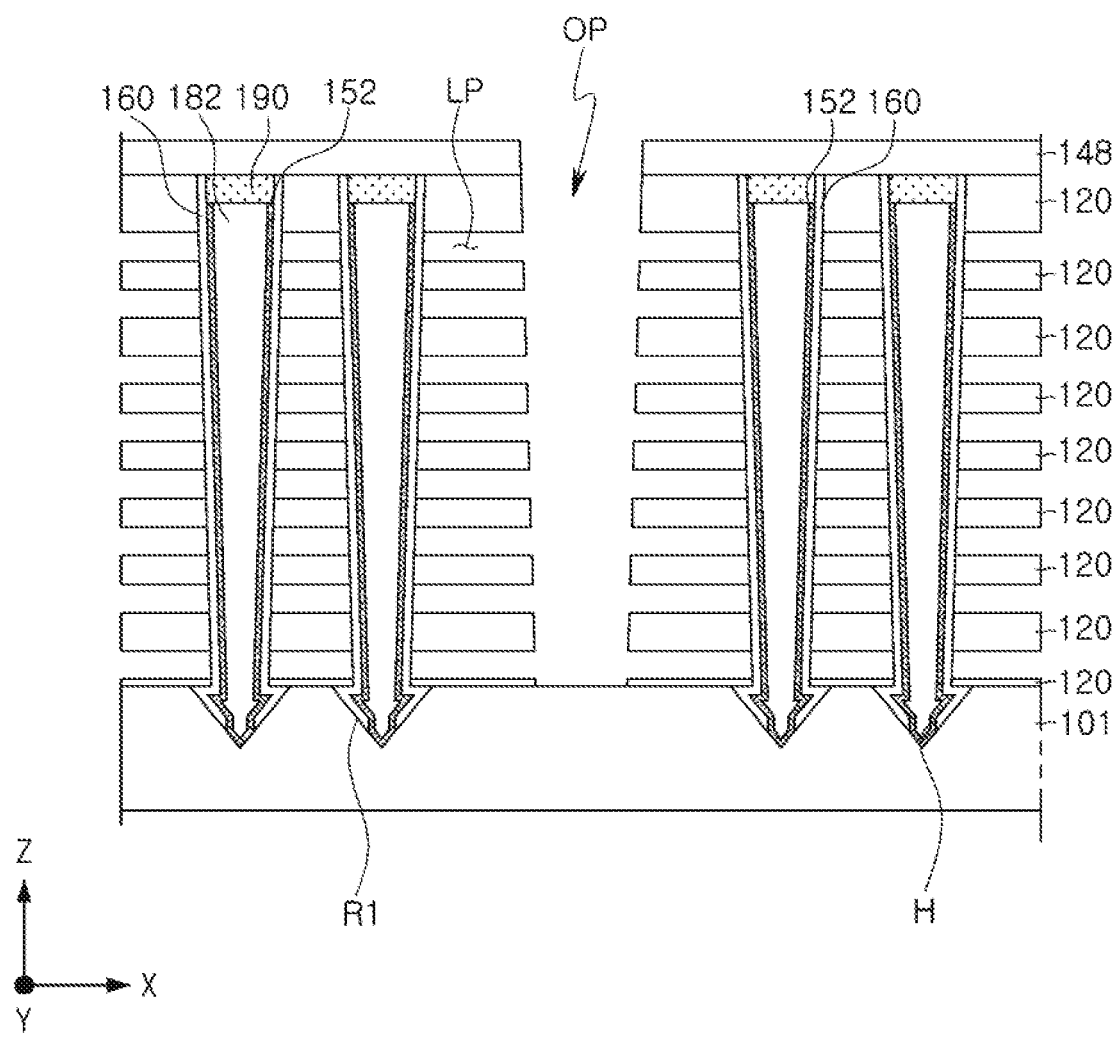

Referring to FIG. 6H, an opening OP for separating the mold stacked structure including the sacrificial layers 110 and the mold insulation layers 120 at predetermined or alternatively, desired intervals may be formed. A plurality of lateral openings LP, which are connected to the opening OP and are defined between the interlayer insulation layers 120, may be formed.

A capping insulation layer 148 may further be formed on the uppermost mold insulation layer 129 and the conductive pad 190, before forming the opening OP. The capping insulation layer 148 may prevent damage to the conductive pads 190, the channel layer 152, and the like during subsequent processes. The opening OP may be formed by anisotropically etching the capping insulation layer 148, the sacrificial layers 110, and the mold insulation layers 120. The opening OP may be formed in a trench shape extending in the Y direction. The opening OP may expose the substrate 101.

The sacrificial layers 110 exposed through the opening OP may be removed by a selective etching process to form a plurality of lateral openings LP. For example, when the sacrificial layers 110 are silicon nitride and the mold insulation layers 120 are silicon oxide, the selective etch process may be performed with an etchant solution including phosphoric acid. The gate dielectric layer 160 may be partially exposed through the lateral openings LP.

Figure 6I:
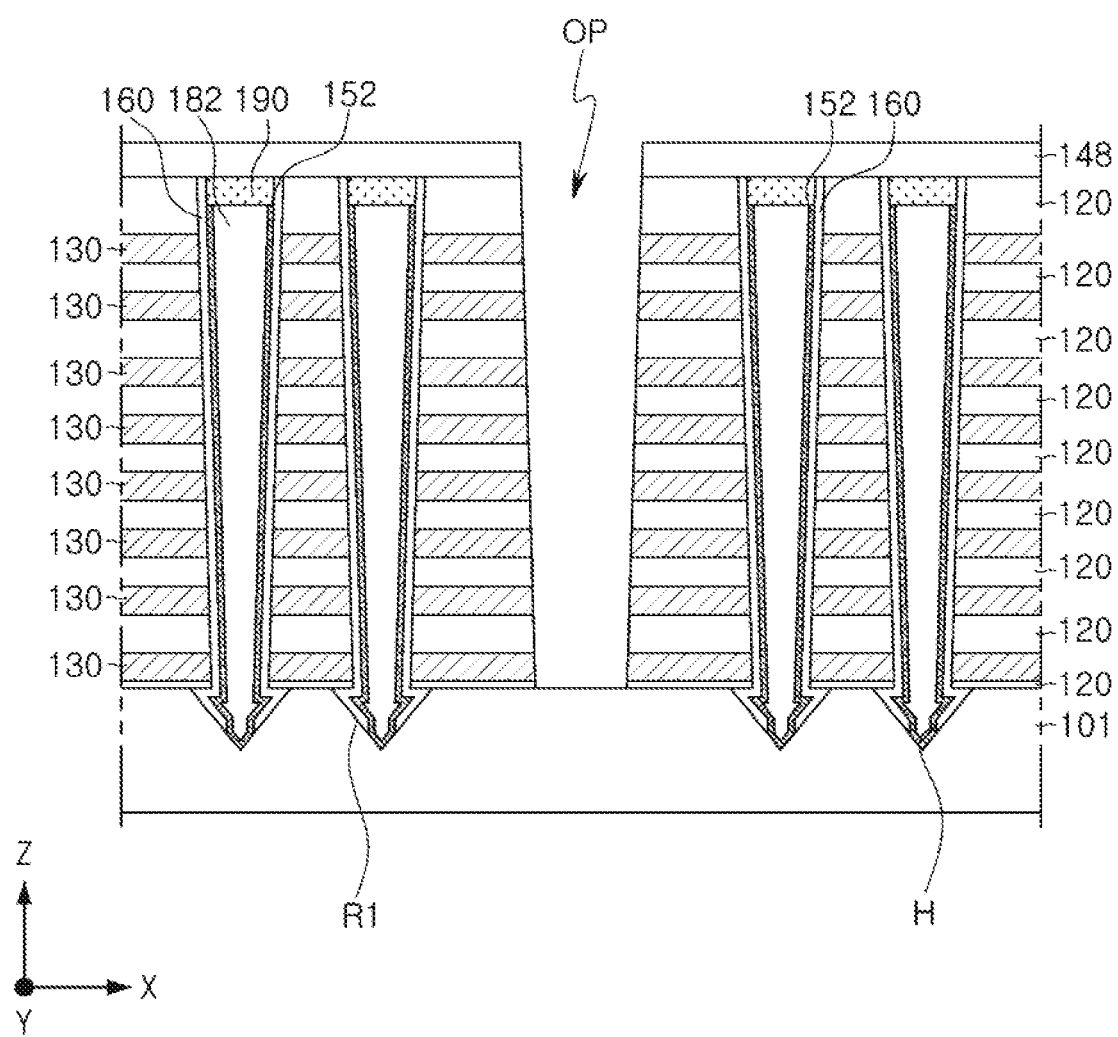

Referring to FIG. 6I, gate electrodes 130 may be formed in the lateral openings LP.

Each of the gate electrodes 130 may include a metal layer and a barrier layer. The barrier layer may be formed on the surfaces of the gate dielectric layer 160, the mold insulation layer 120 and the substrate 101, exposed by the openings OP and the lateral openings LP. Next, the metal layer may be formed to fill the lateral openings LP. The metal layer may include tungsten, and the barrier layer may include tungsten nitride (WN), tantalum nitride (TaN), titanium nitride (TiN), or a combination thereof.

Next, the barrier layer and the metal layer formed in the opening OP may be removed using an additional etching process such that the gate electrode 130 is disposed only in the lateral openings LP.

Figure 6J:
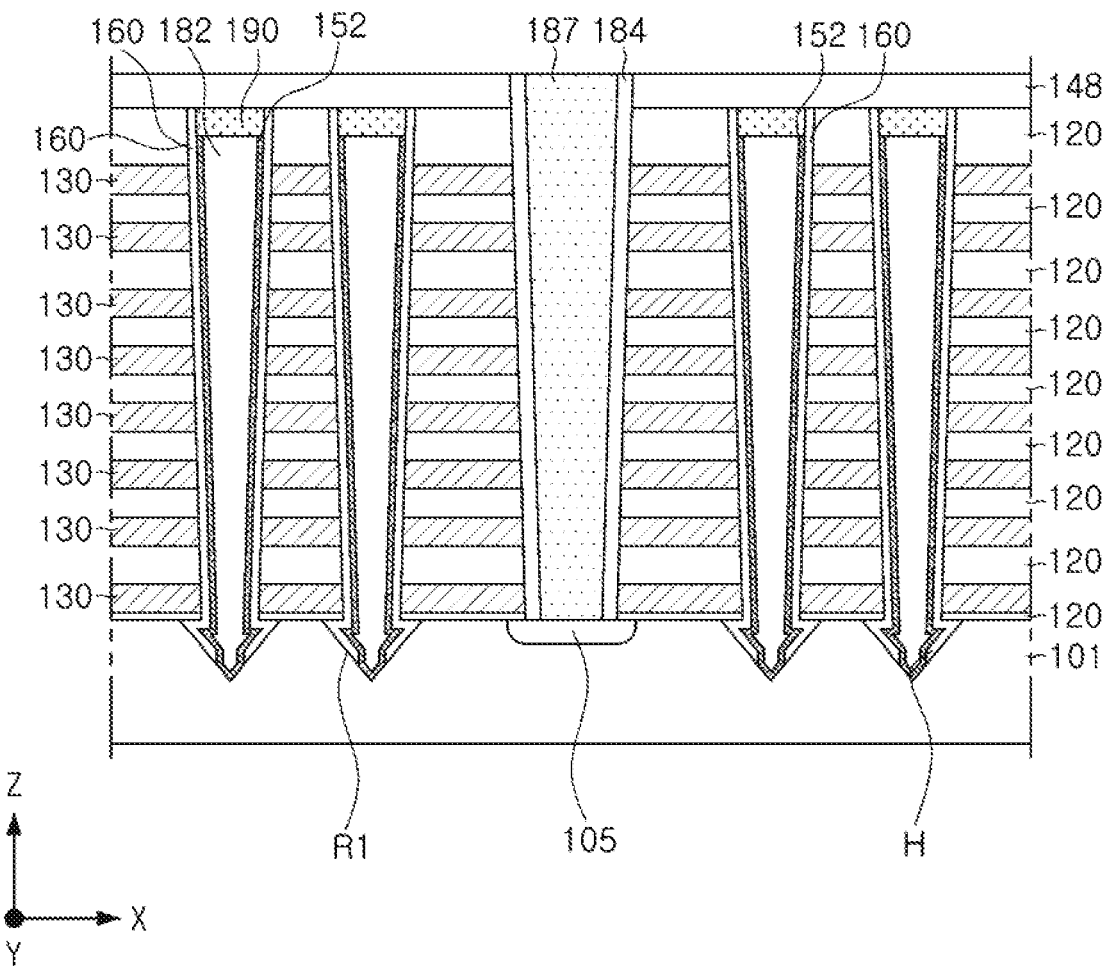

Referring to FIG. 6J, an impurity region 105 may be formed in the substrate 101 in the opening OP, and a second insulation layer 184 and a conductive layer 187 may be formed in the opening OP on the impurity region 105.

First, the impurity region 105 may be formed by implanting an impurity into the substrate 101 exposed by the opening OP using an ion implantation process. Next, the second insulation layer 184 may be formed on the sidewall of the opening OP, and the conductive layer 187 filling remaining space of the opening OP may be formed.

In some embodiments, after forming the second insulation layer 184, the impurity region 105 may be formed. The impurity region 105 may be configured to include regions having different impurity concentrations.

Figure 7:
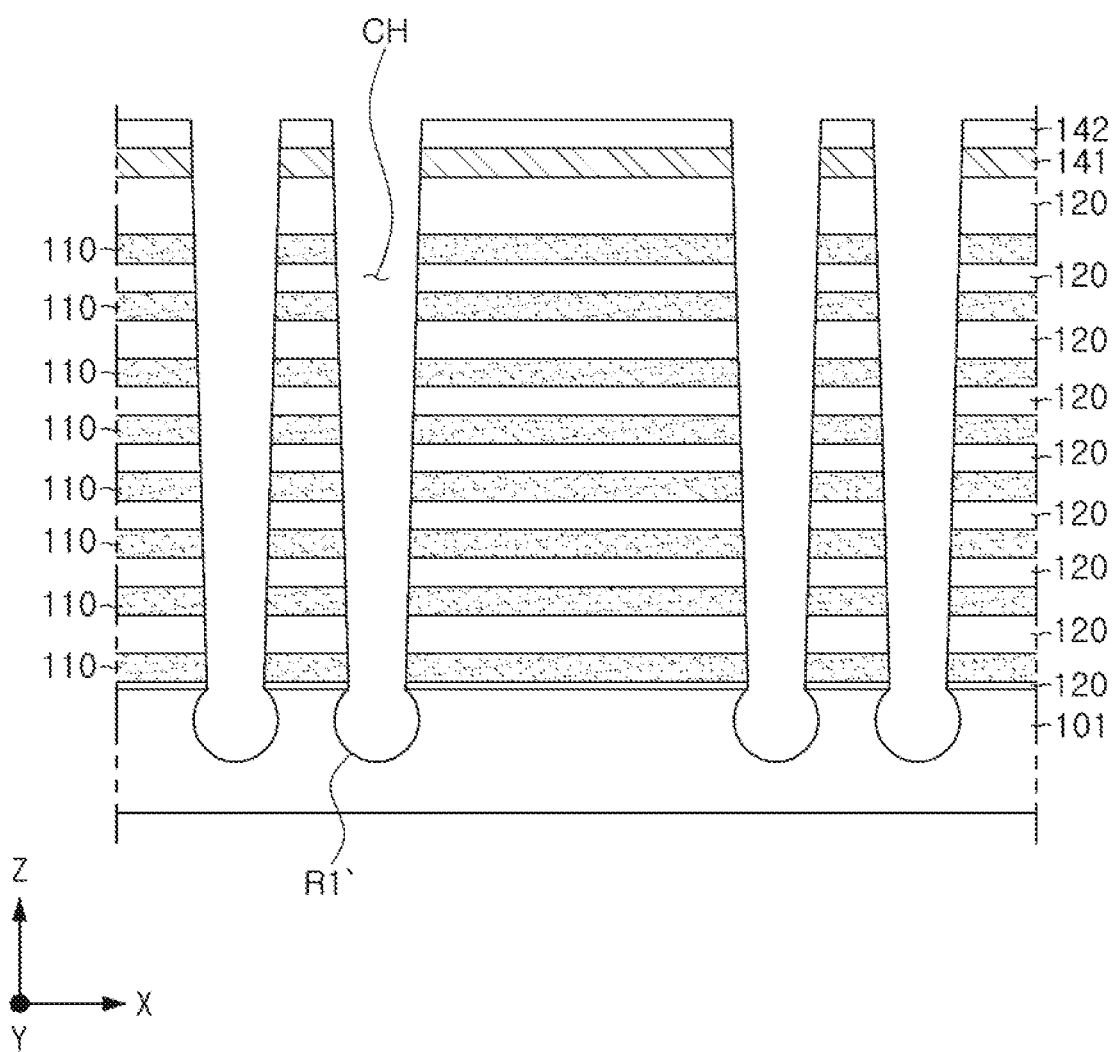
FIG. 7 is a cross-sectional view schematically illustrating a method of manufacturing a three-dimensional semiconductor memory device according to some embodiments of the present inventive concepts.

FIG. 7 is a cross-sectional view schematically illustrating a method of manufacturing a three-dimensional semiconductor memory device according to some embodiments of the present inventive concepts. Referring to FIG. 7, a method of manufacturing the three-dimensional semiconductor memory device of the embodiments illustrated in FIG. 4D will be described.

First, the processes described with reference to FIGS. 6A and 6B may be performed.

Referring to FIG. 7, recesses R1' may be formed in an upper portion of a substrate 101 exposed by channel holes CH.

The recesses R1' may be removed by an isotropic etching process. The isotropic etching process may include a dry etching process or a wet etching process. The recesses R1' may have a spherical shape having a diameter larger than a width (or a diameter) of the channel hole CH.

Next, the processes described with reference to FIGS. 6D to 6J may be proceeded to form a three-dimensional semiconductor memory device including the structure of the embodiments of FIG. 4D.

Figure 8:
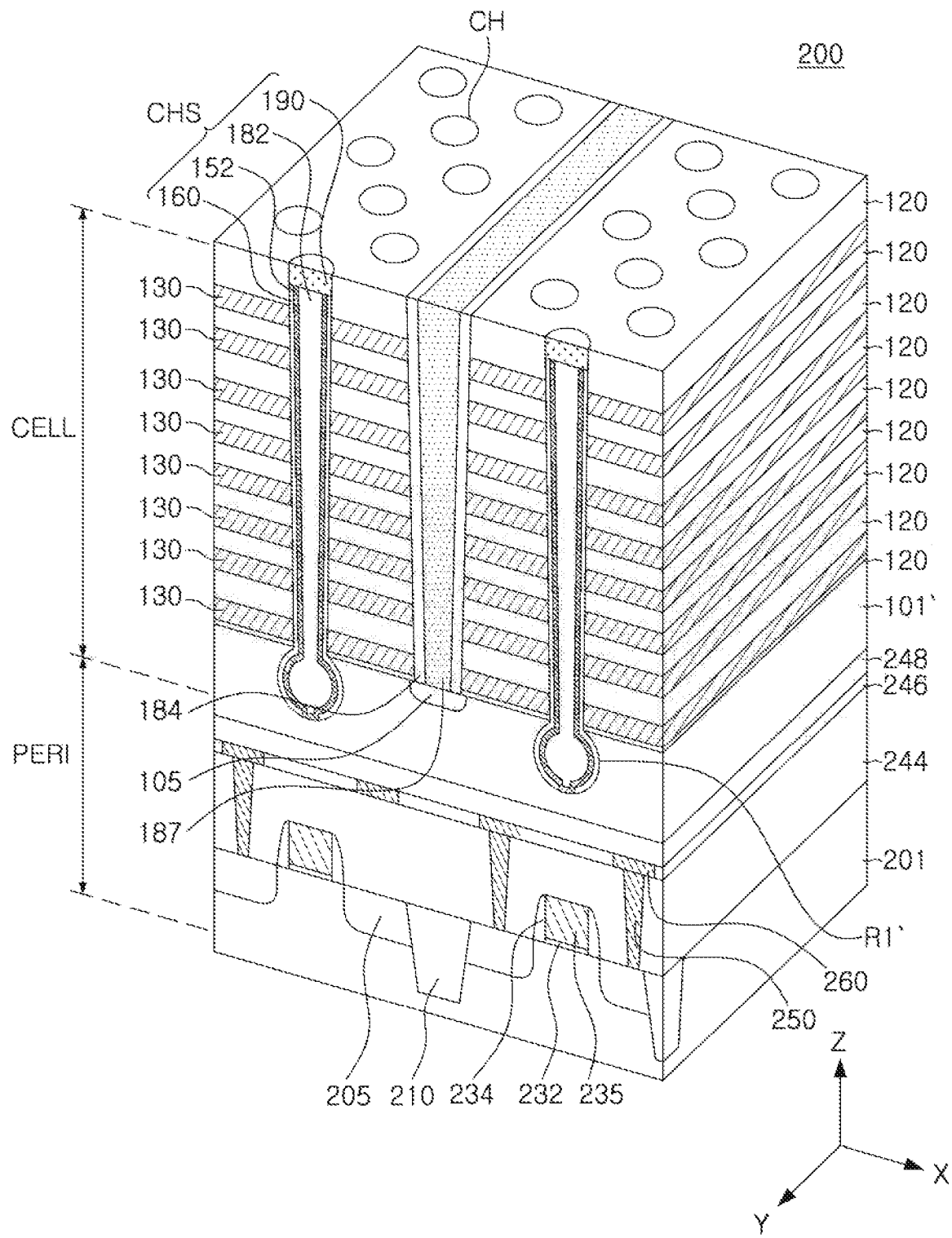
FIG. 8 is a perspective view schematically illustrating a three-dimensional semiconductor memory device according to some embodiments of the present inventive concepts.

FIG. 8 is a perspective view schematically illustrating a three-dimensional semiconductor memory device according to some embodiments of the present inventive concepts.

Referring to FIG. 8, the three-dimensional semiconductor memory device 200 may include a vertically stacked cell region CELL and a peripheral circuit region PERI.

The cell region CELL may correspond to a region in which the memory cell array 20 of FIG. 1 is disposed, and the peripheral circuit region PERI may correspond to a region in which the row decoder 30, the control circuit 50, and the read/write circuit 40 of FIG. 1 are arranged. The cell region CELL may be disposed on the peripheral circuit region PERI.

The cell region CELL may include a substrate 101', a plurality of channel structures CHS arranged in a direction perpendicular to an upper surface of the substrate 101', and a plurality of mold insulation layer 120 and a plurality of gate electrodes 130 alternately stacked along an outer wall of the channel structures CHS. The cell region CELL may further include a gate dielectric layer 160 disposed between the channel layers 152 and the gate electrodes 130, and a conductive layer 187 and a channel layer 152 disposed on the impurity region 105. The substrate 101' may have the same size as a base substrate 201, or may be formed smaller than a base substrate 201. The substrate 101' may be formed of polycrystalline silicon, or may be formed of amorphous silicon and then crystallized.

In some embodiments, the channel structures CHS of the cell region CELL are illustrated to have the same structure as the embodiment of FIG. 4D, but are not limited thereto.

The peripheral circuit region PERI may include a base substrate 201, circuit elements disposed on the base substrate 201, contact plugs 250, and wiring lines 260.

The base substrate 201 may have an upper surface extending in X and Y directions. In the base substrate 201, an element separation layer 210 may be formed to define an active region. A doped region 205 including an impurity may be disposed in a portion of the active region. The base substrate 201 may include a semiconductor material, such as a Group IV semiconductor, a Group III-V compound semiconductor, or a Group II-VI compound semiconductor. For example, a Group IV semiconductor may include silicon, germanium, or silicon-germanium.

The circuit elements may include various types of field effect transistors. The circuit device may include a circuit gate insulation layer 232, a circuit gate electrode 235, and a doped region 205. The doped regions 205 disposed in the base substrate 201 on both sides of the circuit gate electrode 235 may serve as a source region or a drain region.

A plurality of peripheral region insulation layers 244, 246, and 248 may be disposed on a circuit element 230 on the base substrate 201.

The contact plugs 250 may pass through the peripheral region insulation layer 244 to connect to the doped region 205. An electrical signal may be applied to the circuit element 230 by the contact plugs 250. In a region not illustrated, the contact plugs 250 may also be connected to the circuit gate electrode 235. The wiring lines 260 may be connected to the contact plugs 250 and, in some embodiments, may be arranged in multiple layers.

The cell region CELL and the peripheral circuit region PERI may be connected to each other in a region not illustrated.

The three-dimensional semiconductor memory device 200 of some embodiments may be advantageous in realizing a miniaturized device because the cell region CELL and the peripheral circuit region PERI are arranged vertically.

Figure 9:
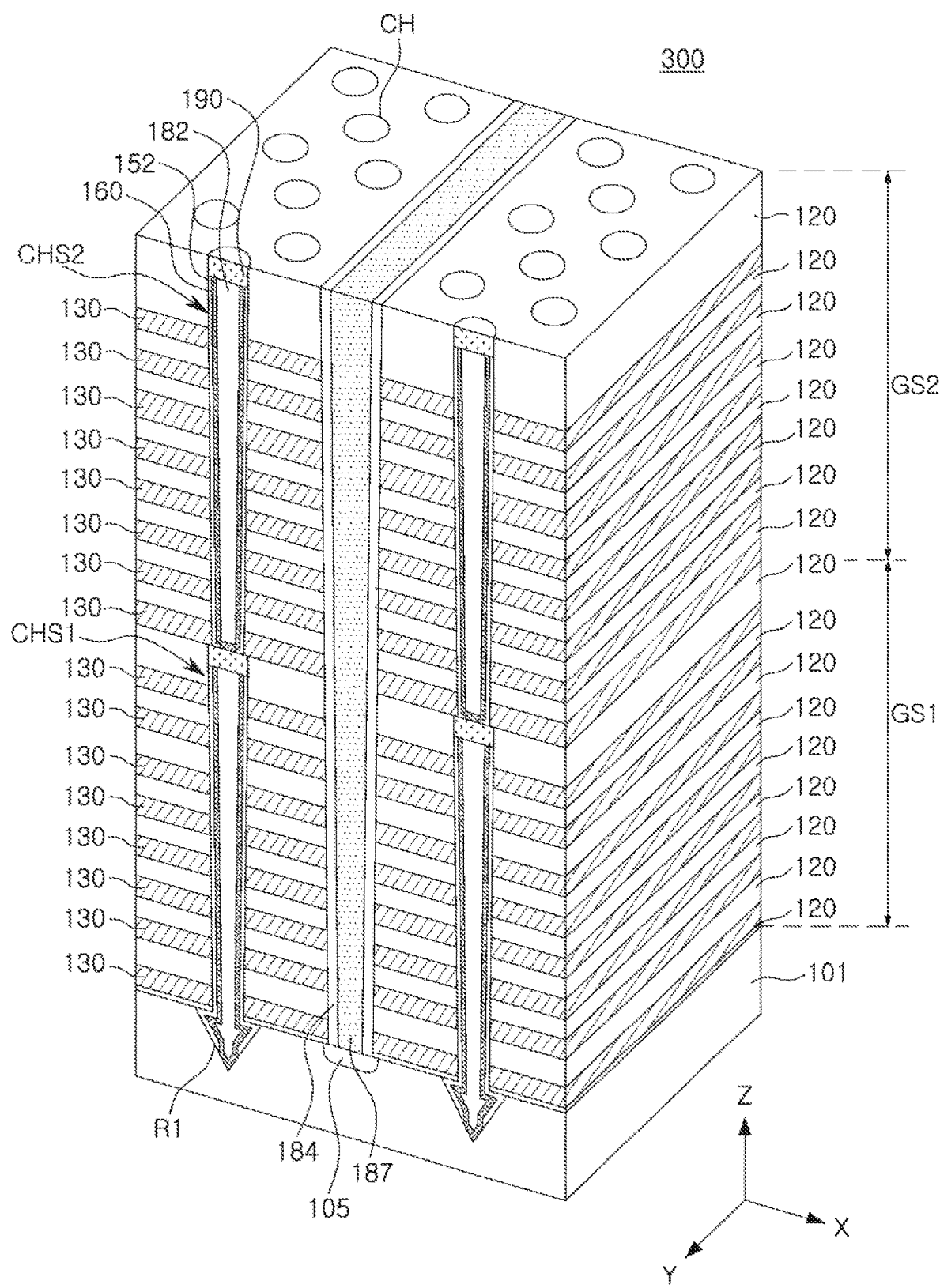
FIG. 9 is a perspective view schematically illustrating a three-dimensional semiconductor memory device according to some embodiments of the present inventive concepts.

FIG. 9 is a perspective view schematically illustrating a three-dimensional semiconductor memory device according to some embodiments of the present inventive concepts.

Referring to FIG. 9, a three-dimensional semiconductor memory device 300 may include first and second gate structures GS1 and GS2 that are sequentially stacked on a substrate 101. Each of the first and second gate electrodes GS1 and GS2 may include mold insulation layers 120 and gate electrodes 130 alternately stacked, respectively. The three-dimensional semiconductor memory device 300 may include a first channel structure CHS1 passing through the first gate structure GS1, and a second channel structures CHS2 passing through the second gate structure GS2 and respectively contacting the first channel structure CHS1. Channel layers 152 of the second channel structures CHS2 may contact conductive pads 190 of the first channel structures CHS1. The first channel structures CHS1 may have the same structure as the channel structure CHS described with reference to FIGS. 3 and 4A.

The three-dimensional semiconductor memory device 300 further may include a conductive layer 187 for dividing the gate structures GS1 and GS2, and an impurity region 105 disposed in the substrate 101 below the conductive layer 187. A second insulation layer 184 may be disposed between the conductive layer 187 and the gate structures GS1 and GS2.

According to some embodiments of the present inventive concepts, the difficulty of an etching process for the channel hole may be reduced by way of separating the etching process for the channel hole and the forming process for the recess in the upper portion of the substrate.

By forming a recess having a width wider than a width of the channel hole in the upper portion of the substrate, the channel structures may better serve as a support during the gate replacement process.

While example embodiments have been illustrated and described above, it will be apparent to those skilled in the art that modifications and variations could be made without departing from the scope of the present inventive concepts as defined by the appended claims.

What is claimed is:

1. A three-dimensional semiconductor memory device comprising:
   gate electrodes and mold insulation layers alternately stacked on a substrate;
   a channel layer passing through the gate electrodes and the mold insulation layers; and
   a gate dielectric layer between the gate electrodes and the channel layer,
   wherein the gate dielectric layer and the channel layer are in an upper portion of the substrate, bent at a first angle, and extend under the mold insulation layers in the upper portion of the substrate,
   wherein the substrate comprises a semiconductor, the semiconductor surrounding the gate dielectric layer in the upper portion of the substrate, and
   wherein the first angle is greater than 90 degrees.

2. The three-dimensional semiconductor memory device according to claim 1, wherein the gate dielectric layer contacts a lower surface of a lowermost mold insulation layer among the mold insulation layers.

3. The three-dimensional semiconductor memory device according to claim 1, wherein the gate dielectric layer and the channel layer are bent at a second angle again toward a lower surface of the substrate.

4. The three-dimensional semiconductor memory device according to claim 3, wherein the second angle is less than 90 degrees.

5. The three-dimensional semiconductor memory device according to claim 1, a portion of the gate dielectric layer in the upper portion of the substrate has inclined surfaces contacting the upper portion of the substrate.

6. The three-dimensional semiconductor memory device according to claim 1, wherein a portion of the gate dielectric layer in the upper portion of the substrate has a convex spherical surface contacting the upper portion of the substrate.

7. The three-dimensional semiconductor memory device according to claim 1, wherein the channel layer passes through the gate dielectric layer to contact the substrate, and has an end portion protruding further downward than a lower end of the gate dielectric layer.

8. The three-dimensional semiconductor memory device according to claim 7, wherein the end portion comprises inclined surfaces.

9. The three-dimensional semiconductor memory device according to claim 8, wherein at least a portion of the end portion has a width wider than a width of an opening of the gate dielectric layer.

10. A three-dimensional semiconductor memory device comprising:
    gate electrodes and mold insulation layers alternately stacked on a substrate; and
    a channel structure passing through the gate electrodes and the mold insulation layers, and in a recess in an upper portion of the substrate,
    wherein a width of the channel structure gradually decreases toward the substrate, and increase again in the upper portion of the substrate,
    wherein the substrate comprises a semiconductor, the semiconductor surrounding the recess,
    wherein the channel structure comprises a gate dielectric layer and a channel layer that pass through the gate electrodes and the mold insulation layers,
    wherein the gate dielectric layer conformally covers a surface of the recess and has an opening in the recess, the channel layer contacts the substrate through the opening of the gate dielectric layer, and
    wherein a surface of the channel structure in the recess comprises a curved surface.

11. The three-dimensional semiconductor memory device according to claim 10, wherein the gate dielectric layer is bent and extends under the mold insulation layers in the upper portion of the substrate.

12. The three-dimensional semiconductor memory device according to claim 10, wherein a surface of the channel structure in the recess comprises inclined surfaces with respect to the upper surface of the substrate.

13. A three-dimensional semiconductor memory device comprising:
- a substrate having a recess;
- gate electrodes and mold insulation layers alternately stacked on the substrate;
- a channel hole passing through the gate electrodes and the mold insulation layers; and
- a channel structure in the channel hole and in the recess of the substrate,
- wherein at least a portion of the recess has a width wider than a width of a lower portion of the channel hole,
- wherein the substrate comprises a semiconductor, the semiconductor surrounding the recess,
- wherein the channel structure comprises a gate dielectric layer and a channel layer extending along a sidewall of the channel hole,
- wherein the gate dielectric layer conformally covers a surface of the recess, and the channel layer passes through the gate dielectric layer to contact the substrate,
- wherein the recess has an inverted pyramid shape having a largest width on an upper surface of the substrate, and
- wherein the gate dielectric layer contacts a portion of a lower surface of a lowermost mold insulation layer among the mold insulation layers.

* * * * *